United States Patent
Wang et al.

(10) Patent No.: US 11,322,507 B2
(45) Date of Patent: May 3, 2022

(54) METHOD OF MAKING MEMORY CELLS, HIGH VOLTAGE DEVICES AND LOGIC DEVICES ON A SUBSTRATE WITH SILICIDE ON CONDUCTIVE BLOCKS

(71) Applicant: Silicon Storage Technology, Inc., San Jose, CA (US)

(72) Inventors: Chunming Wang, Shanghai (CN); Jack Sun, Shanghai (CN); Xian Liu, Sunnyvale, CA (US); Leo Xing, Shanghai (CN); Nhan Do, Saratoga, CA (US); Andy Yang, Shanghai (CN); Guo Xiang Song, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 17/185,709

(22) Filed: Feb. 25, 2021

(65) Prior Publication Data

US 2022/0052059 A1 Feb. 17, 2022

(30) Foreign Application Priority Data

Aug. 17, 2020 (CN) .......................... 202010826250.6

(51) Int. Cl.
| | | |
|---|---|---|
| *H01L 21/00* | (2006.01) | |
| *H01L 27/11531* | (2017.01) | |
| *H01L 27/11521* | (2017.01) | |
| *H01L 29/788* | (2006.01) | |
| *H01L 29/66* | (2006.01) | |
| *H01L 21/28* | (2006.01) | |
| *H01L 29/49* | (2006.01) | |

(52) U.S. Cl.
CPC .. *H01L 27/11531* (2013.01); *H01L 21/28052* (2013.01); *H01L 27/11521* (2013.01);
(Continued)

(58) Field of Classification Search
CPC ......... H01L 27/11531; H01L 29/40114; H01L 21/28052; H01L 27/11521; H01L 29/4933; H01L 29/66825; H01L 29/7883
See application file for complete search history.

(56) References Cited

U.S. PATENT DOCUMENTS 5,198,380 A * 3/1993 Harari ................. G11C 11/5621
 438/257
6,483,709 B1 * 11/2002 Layton ................. H05K 7/1454
 361/679.4
(Continued)

FOREIGN PATENT DOCUMENTS

| TW | 202013680 A | 4/2020 |
|---|---|---|
| TW | 202029301 A | 8/2020 |

OTHER PUBLICATIONS

U.S. Appl. No. 17/129,865, filed Dec. 21, 2020 entitled "Method of Making Memory Cells, High Voltage Devices and Logic Devices on a Substrate," Sun et al.
(Continued)

*Primary Examiner* — Richard A Booth
(74) *Attorney, Agent, or Firm* — DLA Piper LLP (US)

(57) ABSTRACT

A method of forming a semiconductor device includes recessing the upper surface of first and second areas of a semiconductor substrate relative to the third area of the substrate, forming a pair of stack structures in the first area each having a control gate over a floating gate, forming a first source region in the substrate between the pair of stack structures, forming an erase gate over the first source region, forming a block of dummy material in the third area, forming select gates adjacent the stack structures, forming high voltage gates in the second area, forming a first blocking layer over at least a portion of one of the high voltage gates, forming silicide on a top surface of the high
(Continued)

voltage gates which are not underneath the first blocking layer, and replacing the block of dummy material with a block of metal material.

17 Claims, 36 Drawing Sheets

(52) U.S. Cl.
CPC .... *H01L 29/40114* (2019.08); *H01L 29/4933* (2013.01); *H01L 29/66825* (2013.01); *H01L 29/7883* (2013.01)

(56) References Cited

U.S. PATENT DOCUMENTS

| | | | |
|---|---|---|---|
| 6,747,310 B2 | 6/2004 | Fan et al. | |
| 7,868,375 B2 | 1/2011 | Liu et al. | |
| 7,927,994 B1 | 4/2011 | Liu et al. | |
| 9,276,005 B1 | 3/2016 | Zhou et al. | |
| 2004/0005758 A1* | 1/2004 | Chang | H01L 27/10891 438/257 |
| 2019/0172942 A1 | 6/2019 | Yang et al. | |
| 2019/0326305 A1 | 10/2019 | Zhou et al. | |
| 2019/0393234 A1 | 12/2019 | Lin et al. | |
| 2019/0393235 A1 | 12/2019 | Teng et al. | |
| 2020/0058664 A1 | 2/2020 | Lin et al. | |
| 2020/0135274 A1 | 4/2020 | Yi et al. | |

OTHER PUBLICATIONS

PCT Search Report and Written Opinion dated Jun. 30, 2021—PCT Patent Application No. US2021/020960.
Taiwanese Search Report dated Mar. 4, 2022 corresponding to the counterpart Taiwanese Patent Application No. 110127291.

* cited by examiner

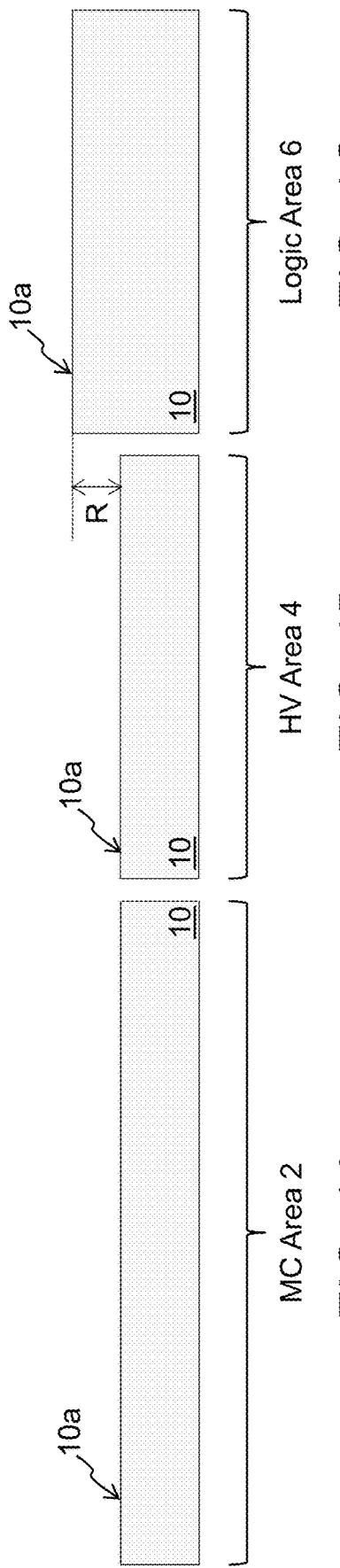

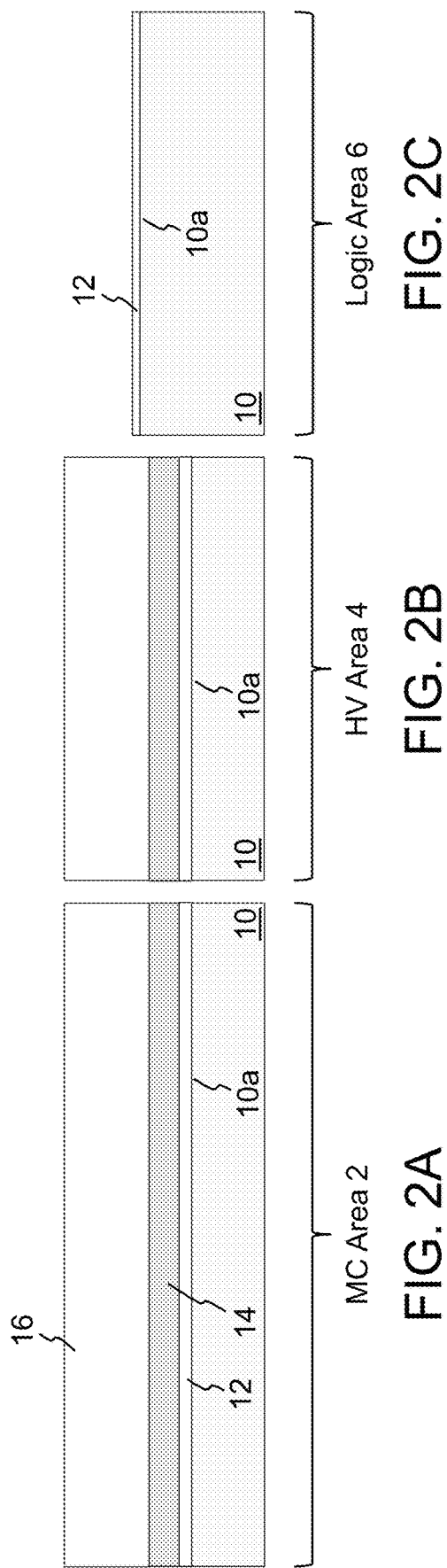

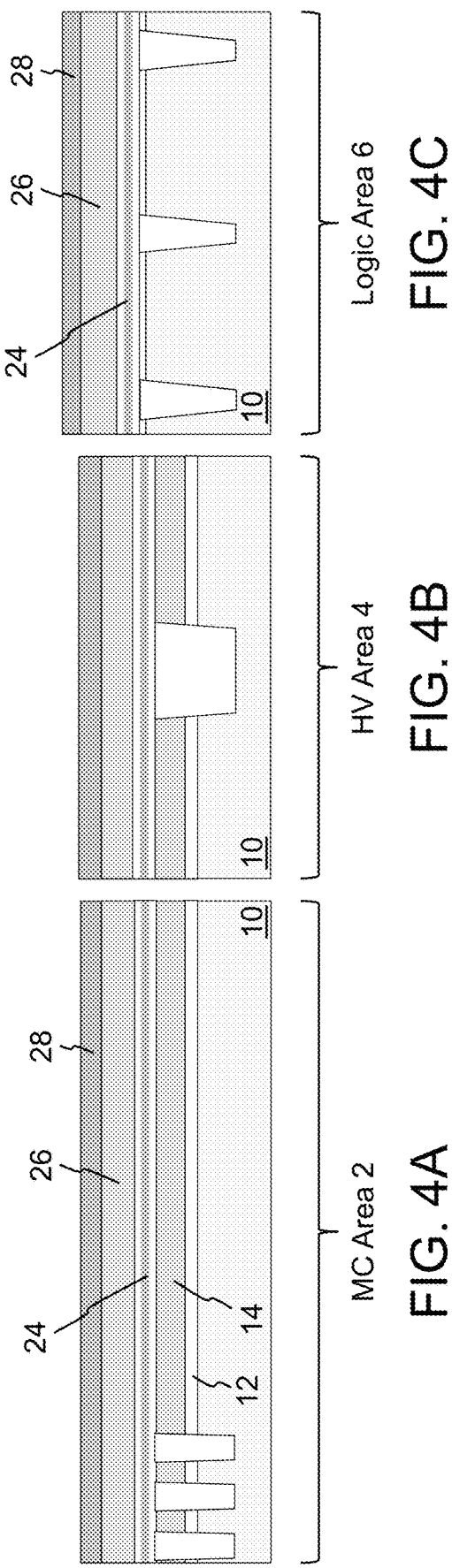

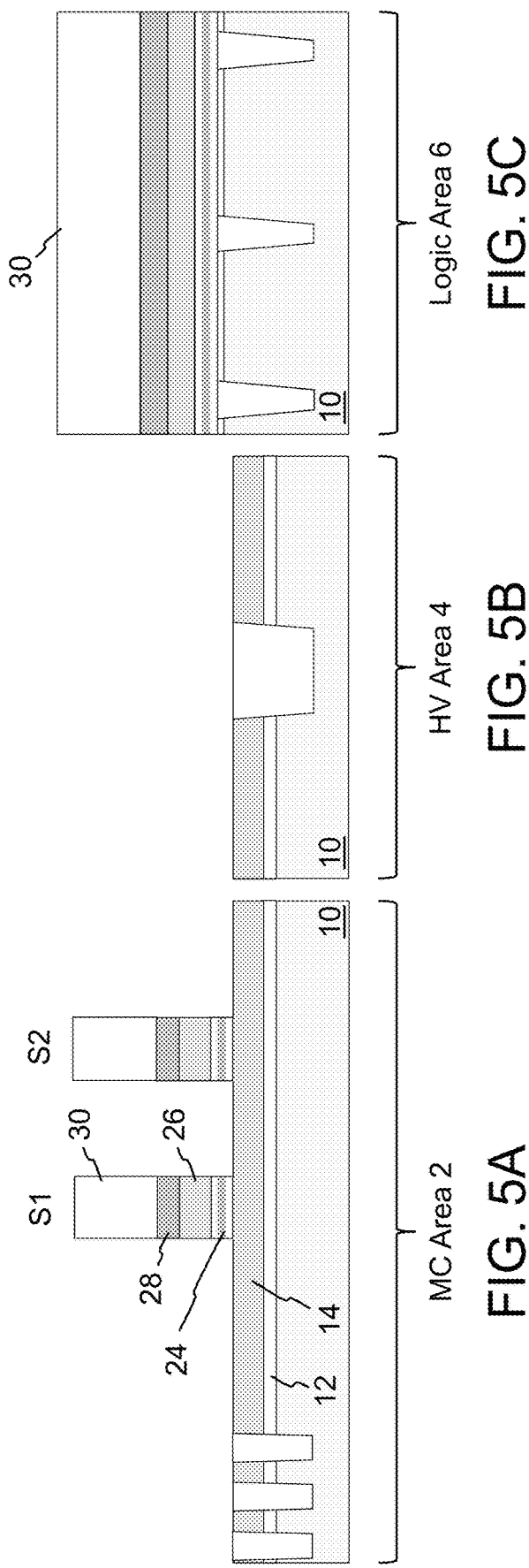

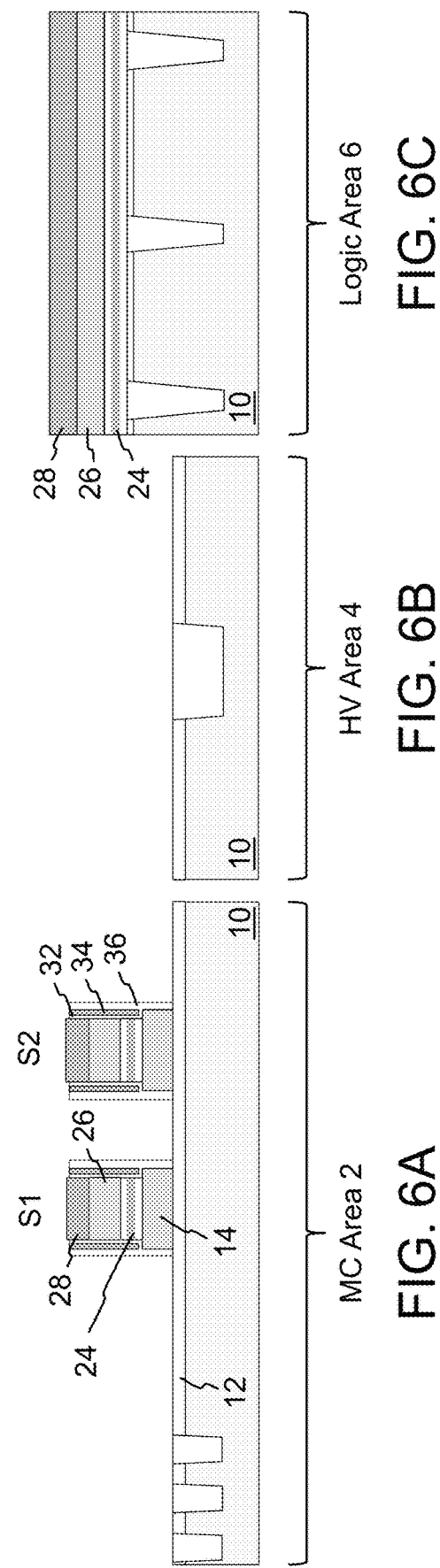

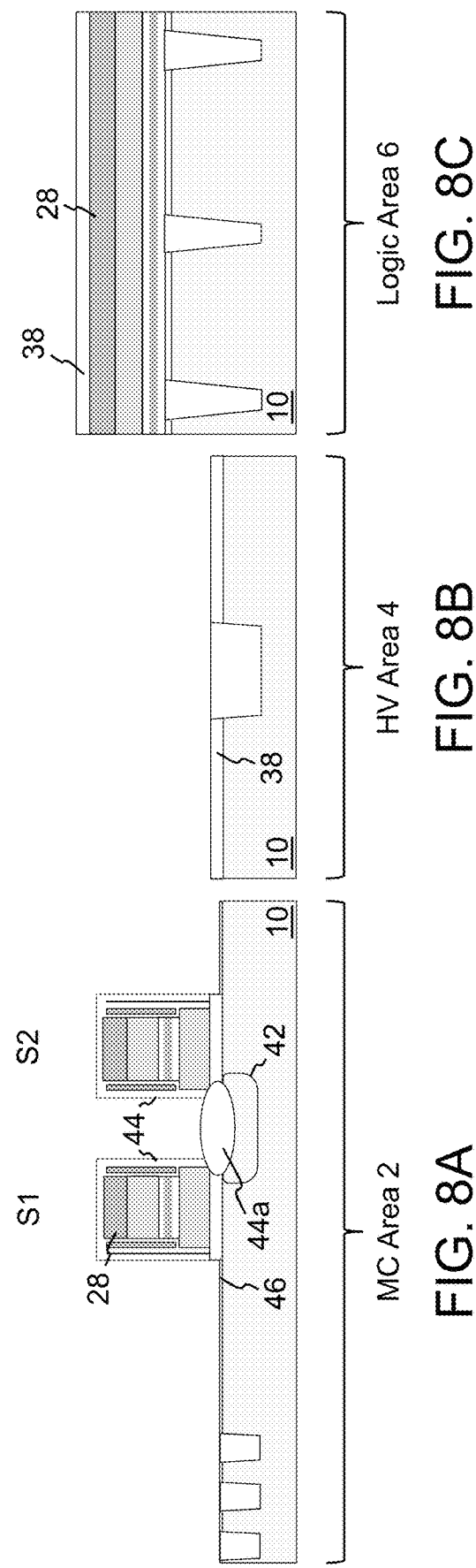

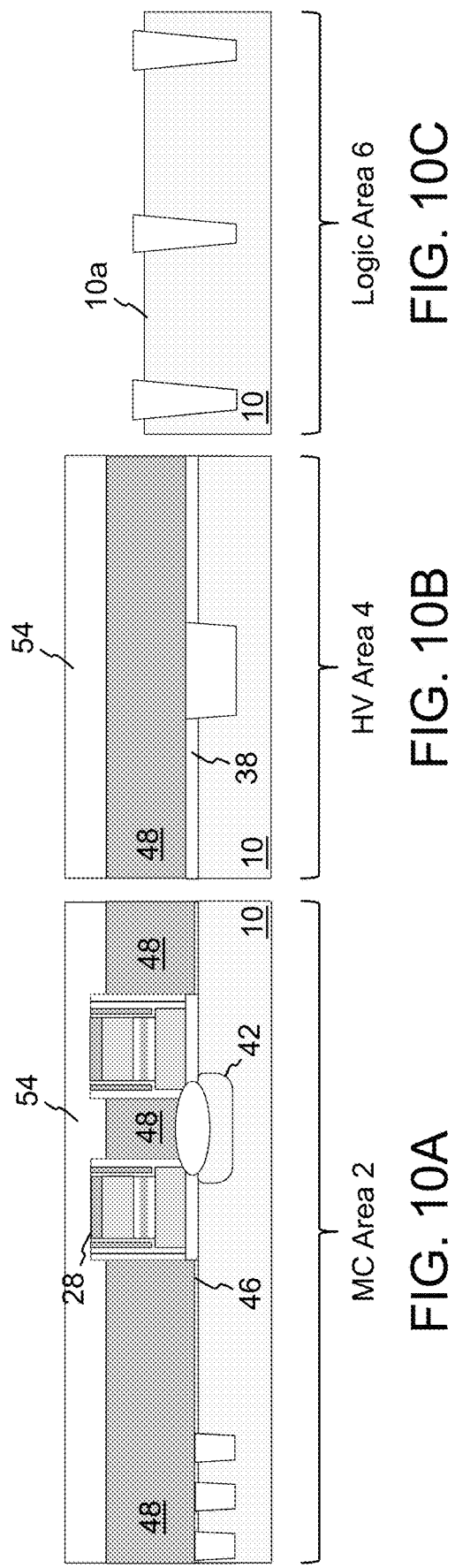

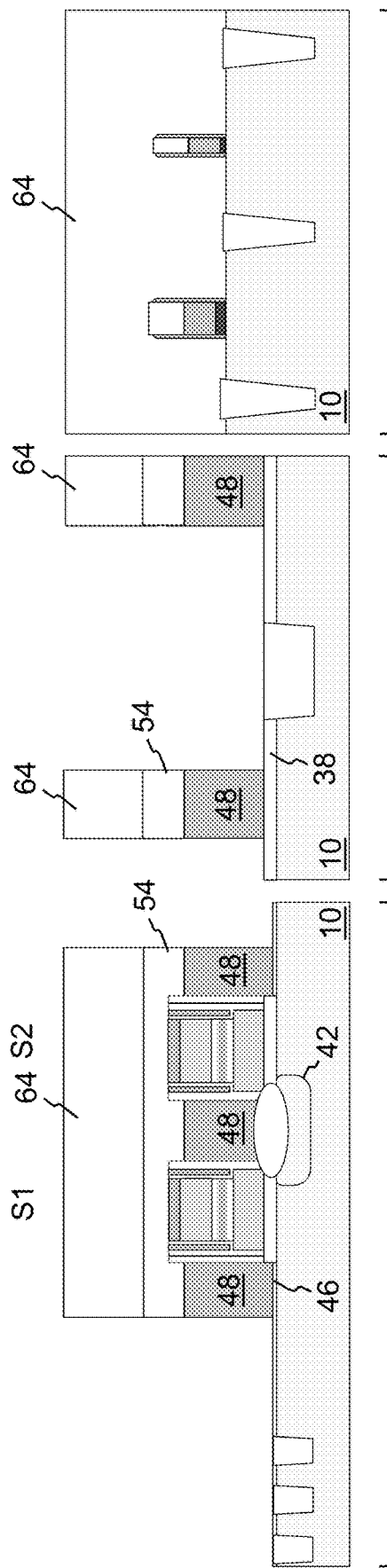

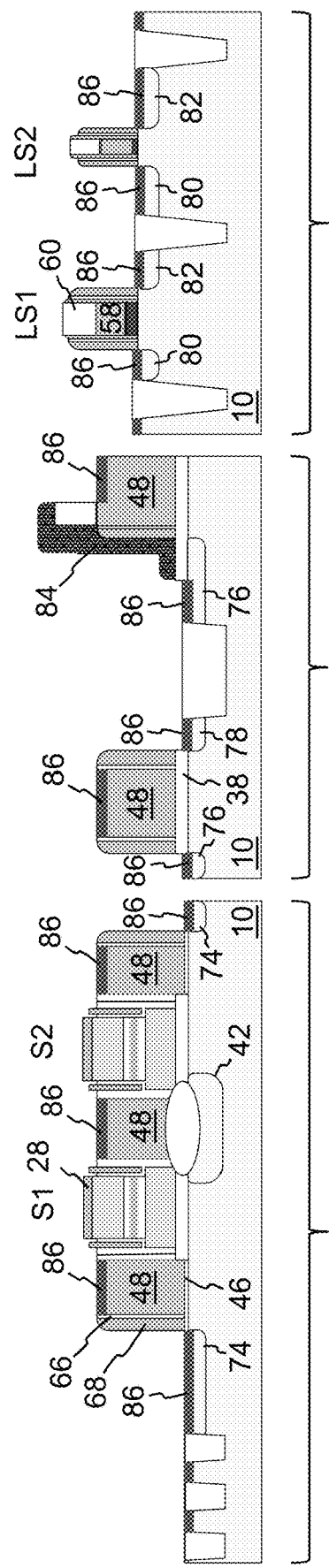

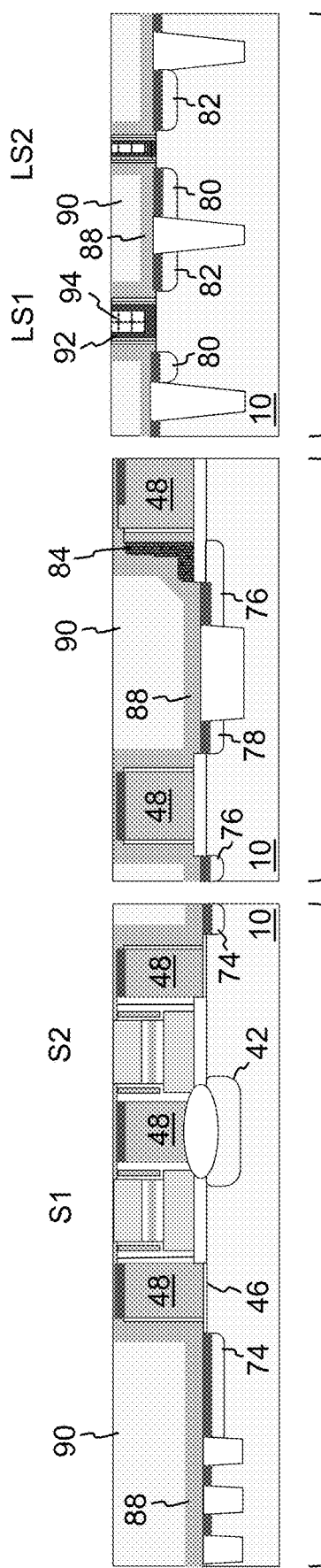

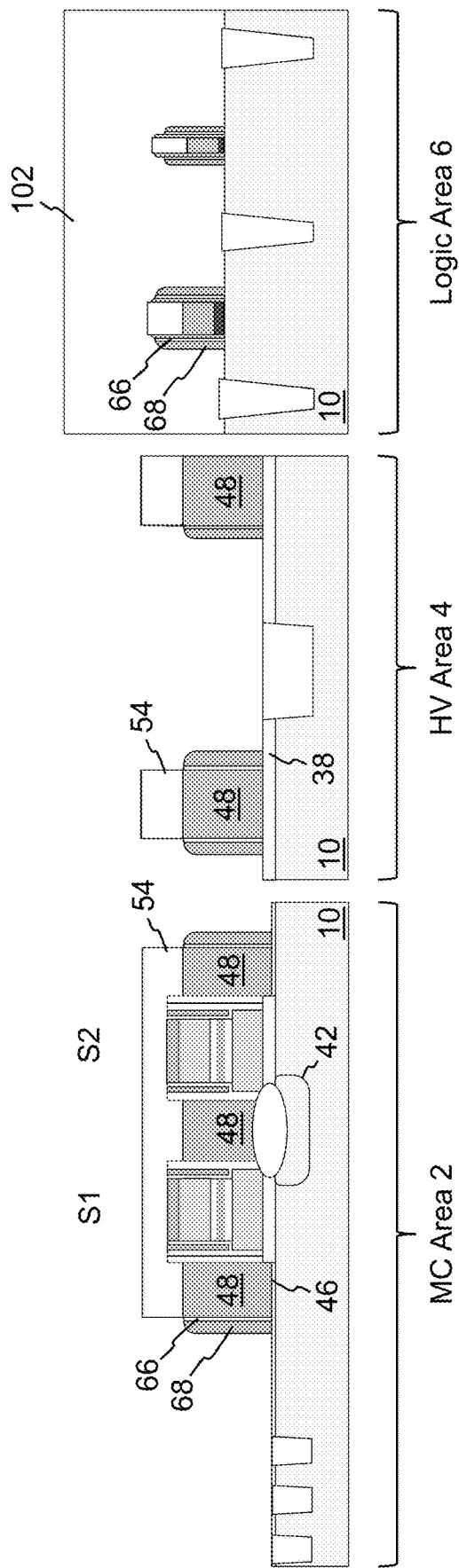

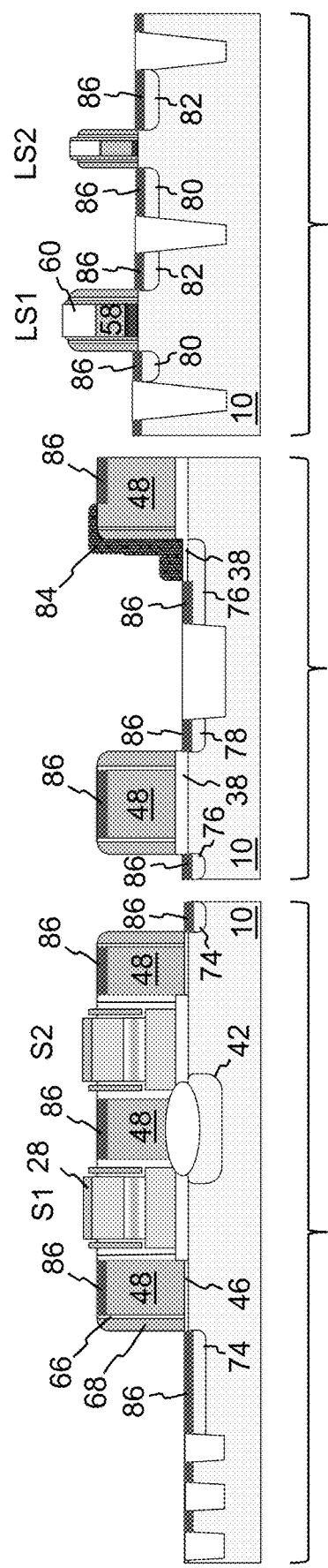

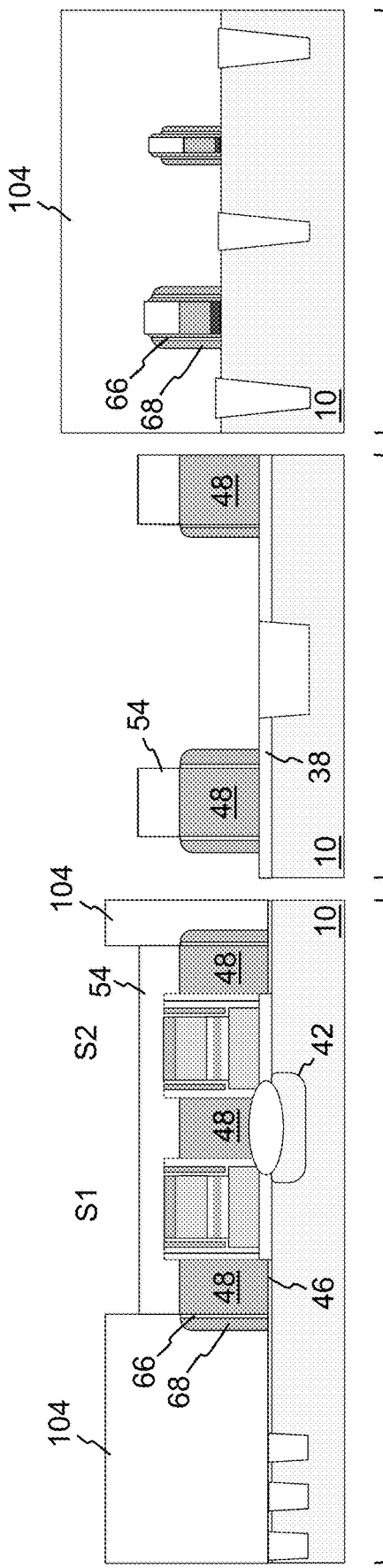

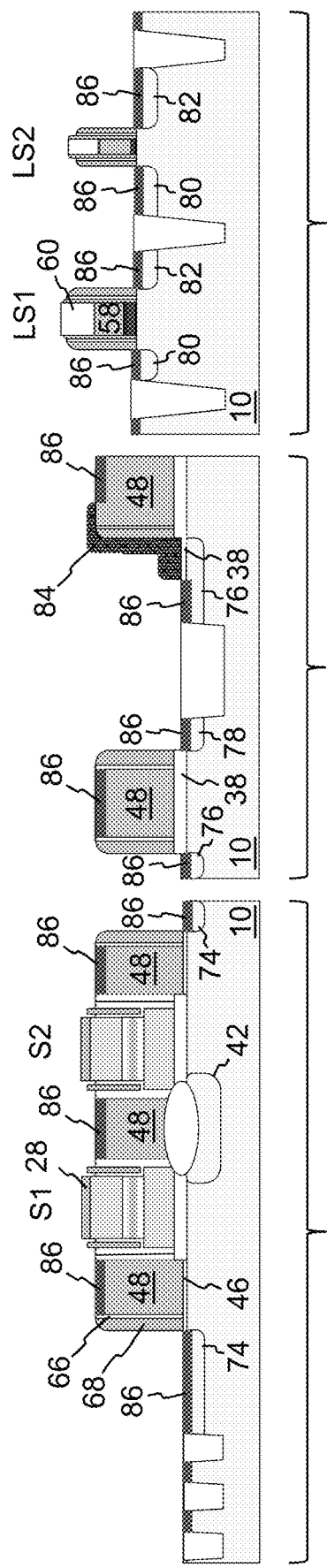

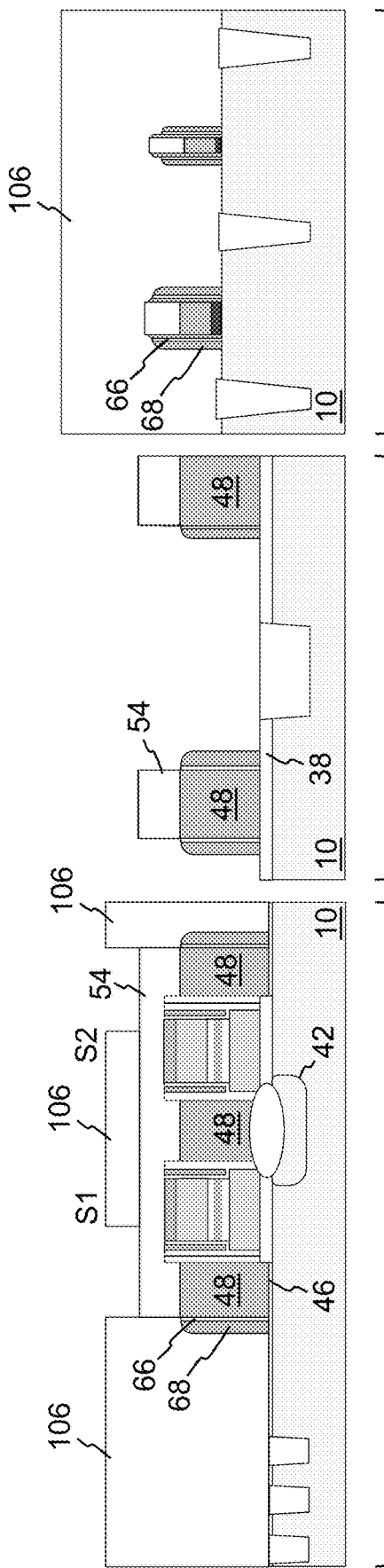

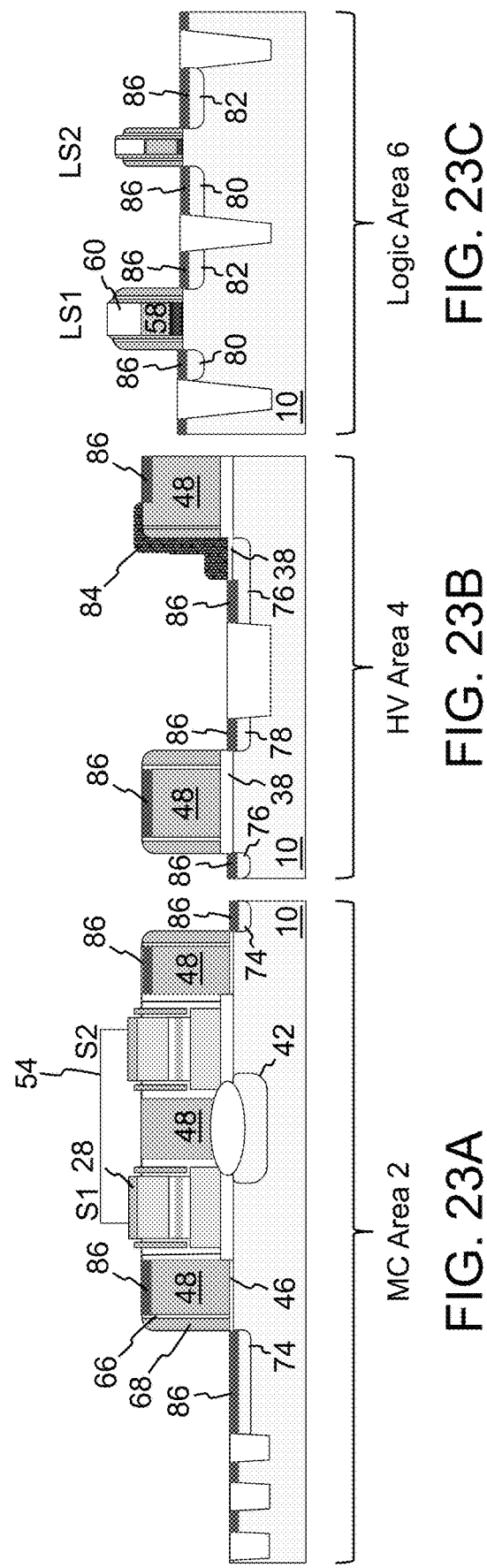

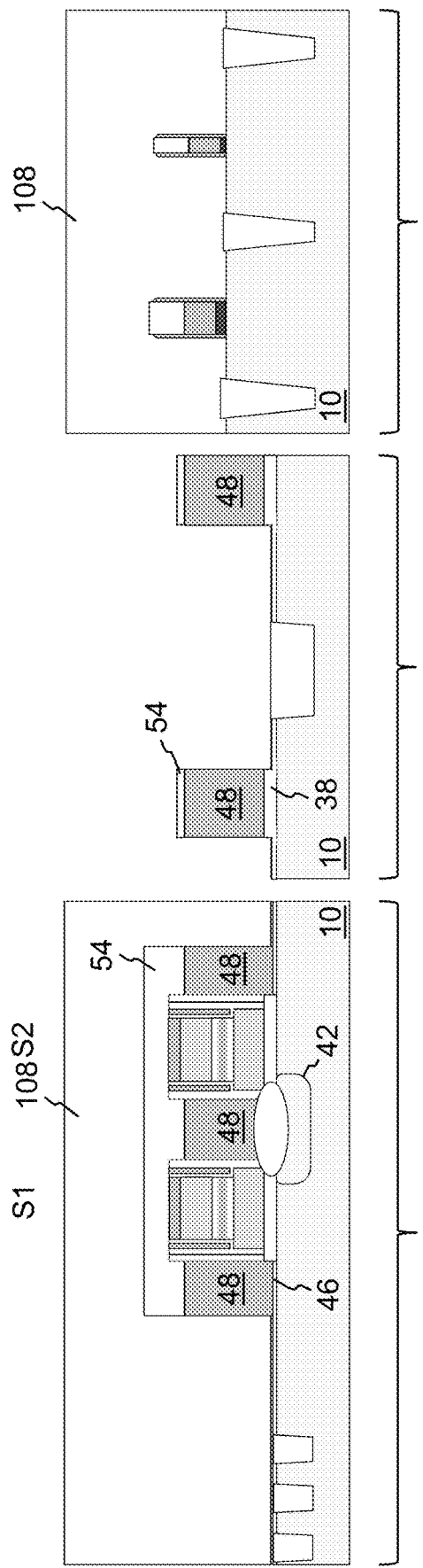

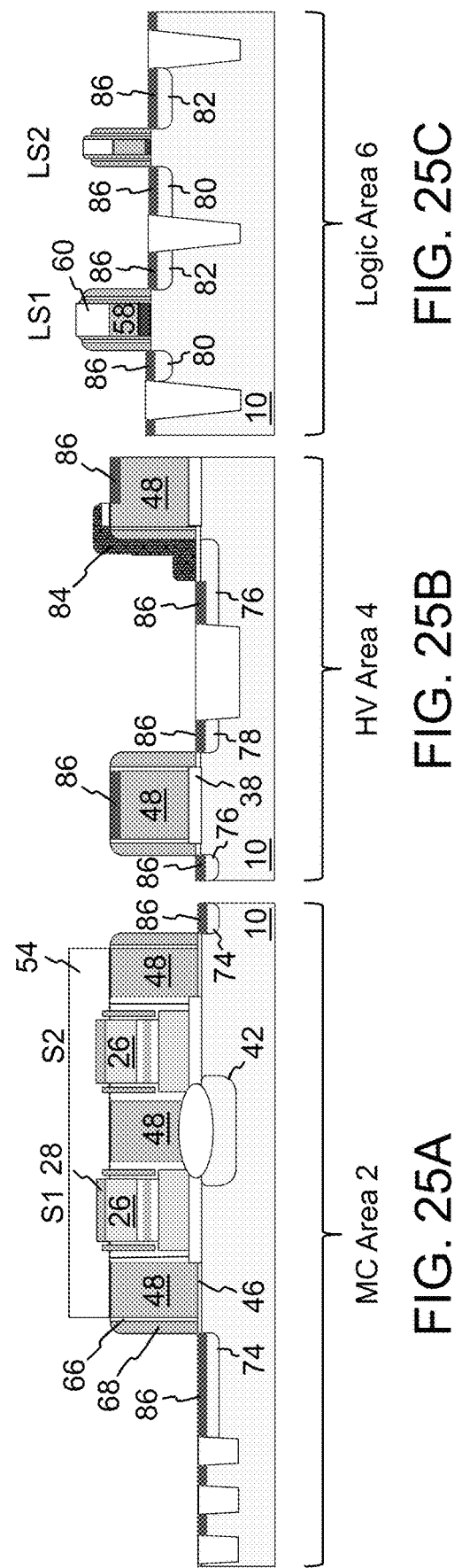

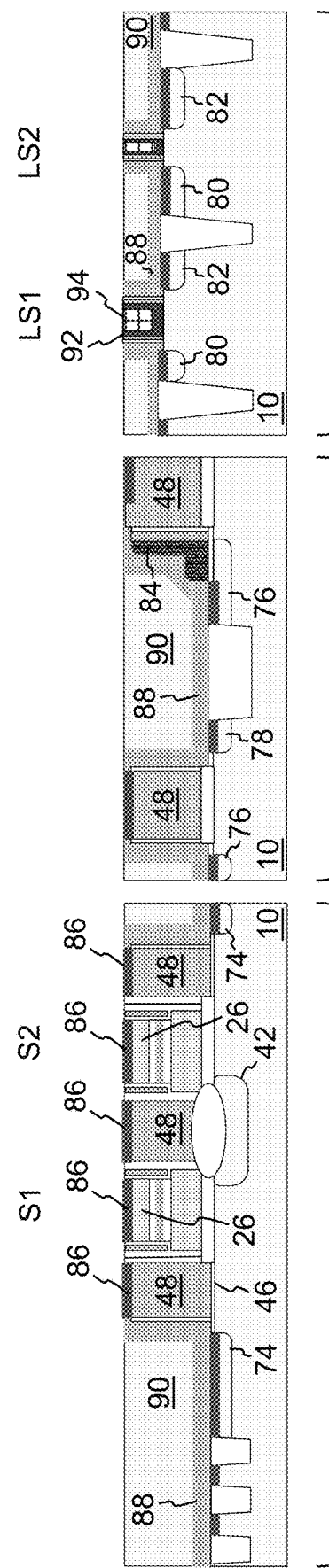

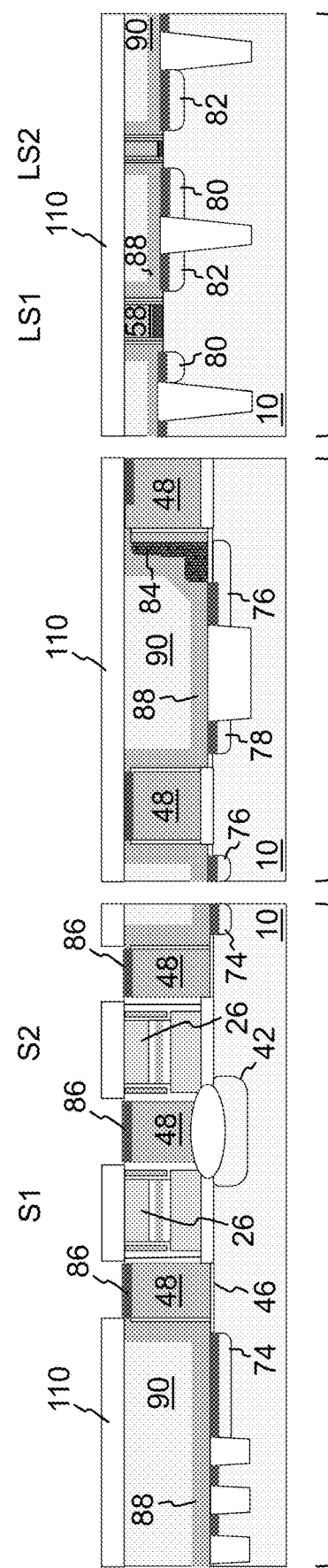

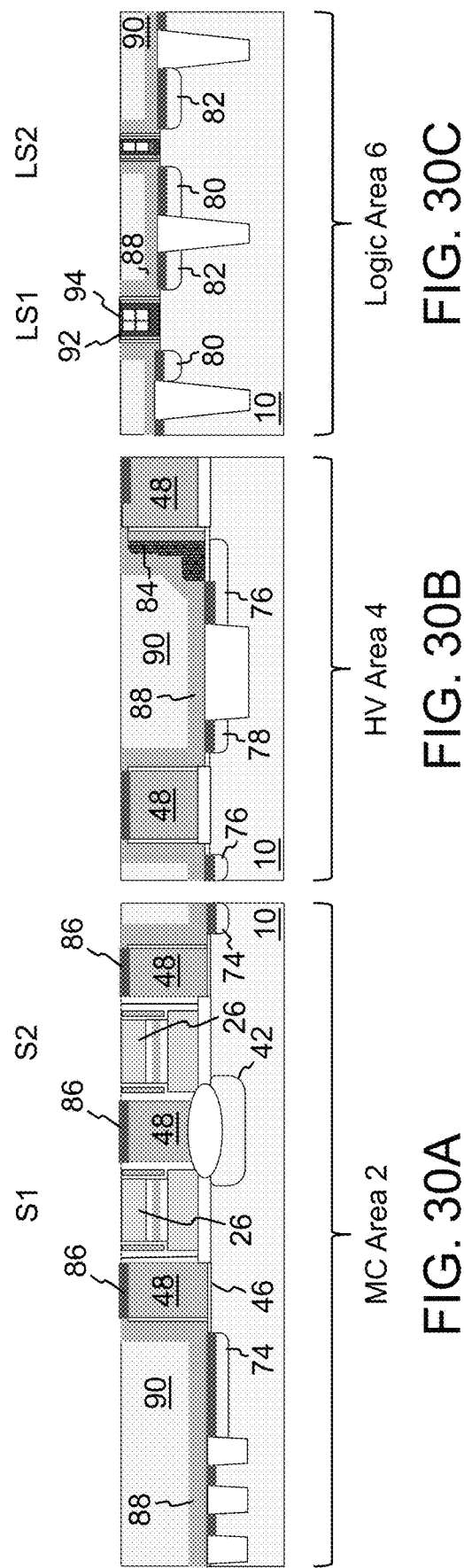

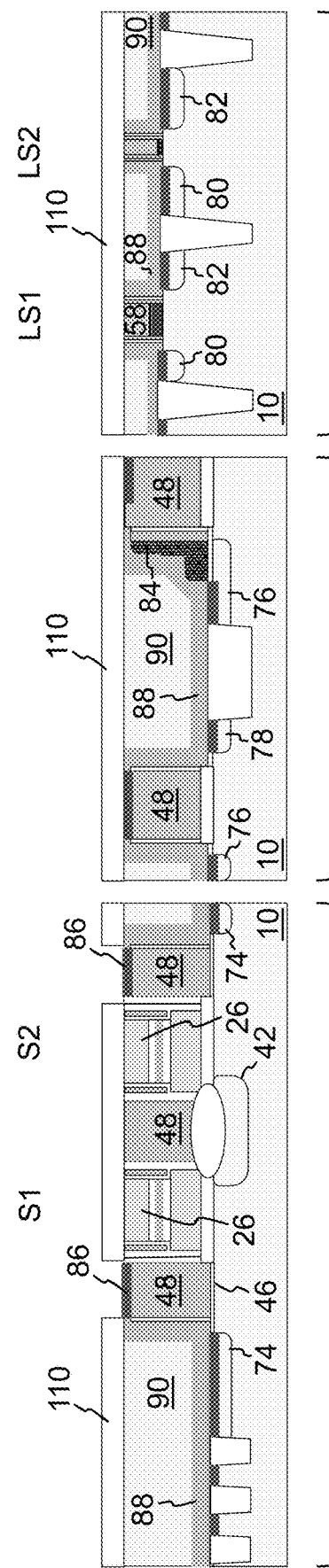

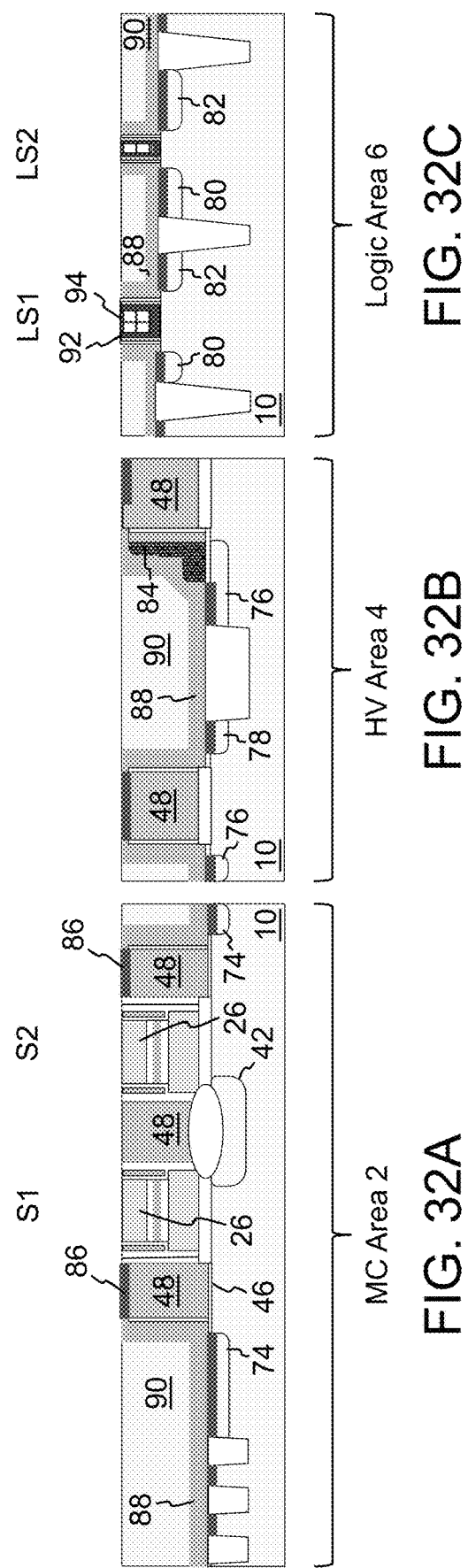

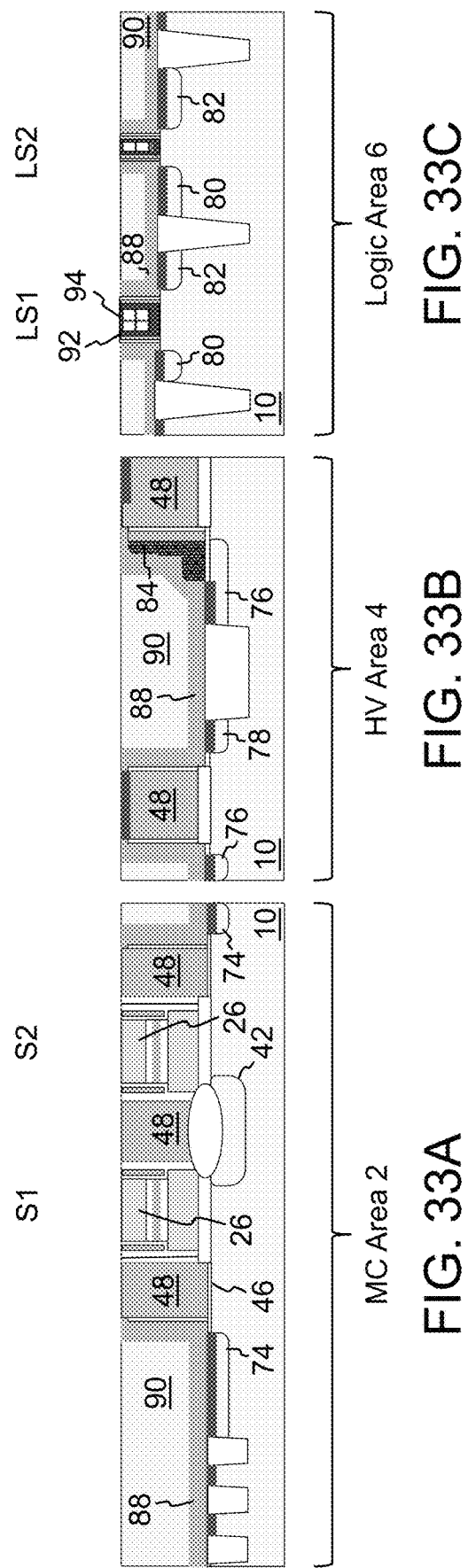

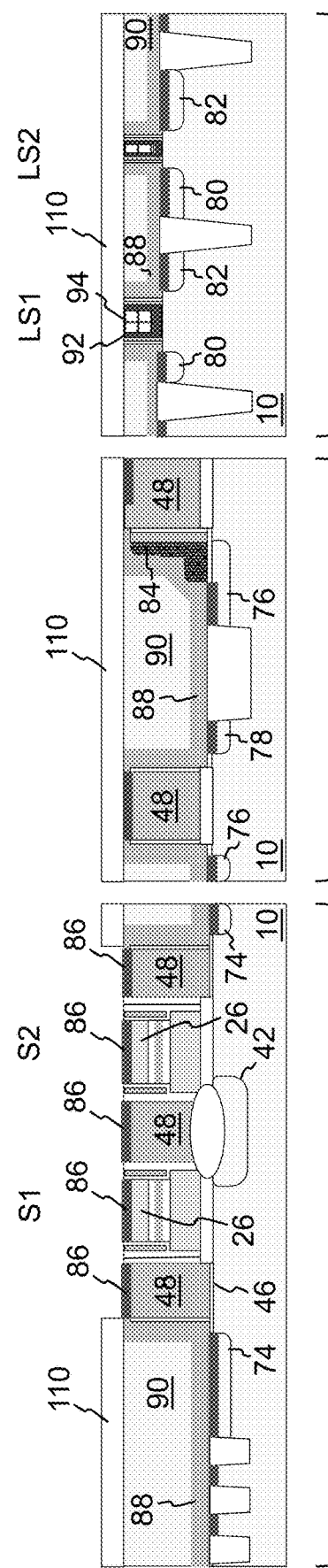

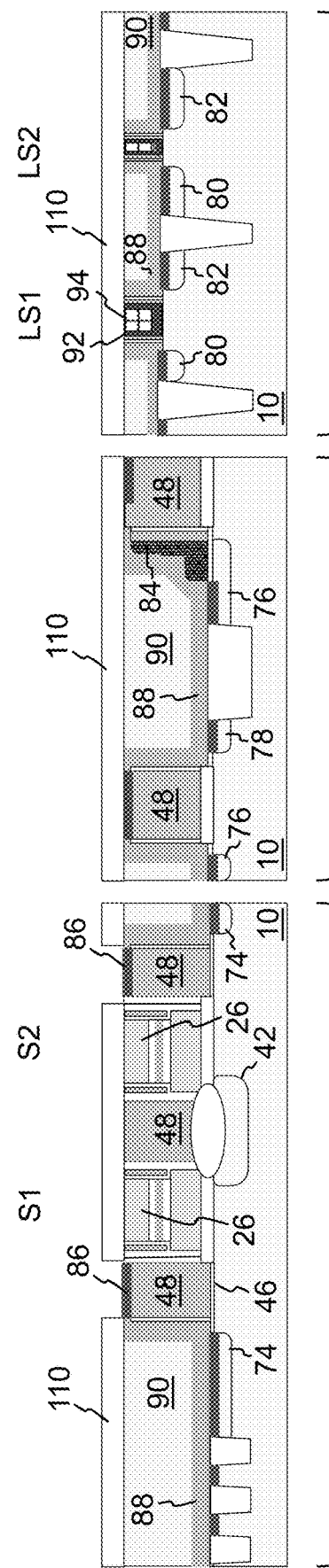

METHOD OF MAKING MEMORY CELLS, HIGH VOLTAGE DEVICES AND LOGIC DEVICES ON A SUBSTRATE WITH SILICIDE ON CONDUCTIVE BLOCKS

PRIORITY CLAIM

This patent application claims priority to Chinese Patent Application No. 202010826250.6 filed on Aug. 17, 2020, entitled "Method Of Making Memory Cells, High Voltage Devices And Logic Devices On A Substrate With Silicide On Conductive Blocks."

FIELD OF THE INVENTION

The present invention relates to semiconductor devices with embedded non-volatile memory cells.

BACKGROUND OF THE INVENTION

Non-volatile memory semiconductor devices formed on silicon semiconductor substrates are well known. For example, U.S. Pat. Nos. 6,747,310, 7,868,375 and 7,927,994 disclose memory cells with four gates (floating gate, control gate, select gate and erase gate) formed on a semiconductor substrate, which are incorporated herein by reference for all purposes. Source and drain regions are formed as diffusion implant regions into the substrate, defining a channel region therebetween in the substrate. The floating gate is disposed over and controls the conductivity of a first portion of the channel region, the select gate is disposed over and controls the conductivity of a second portion of the channel region, the control gate is disposed over the floating gate, and the erase gate is disposed over the source region and laterally adjacent to the floating gate.

It is also known to form low and high voltage logic devices on the same substrate as the non-volatile memory cells. See for example U.S. Pat. No. 9,276,005, which is incorporated herein by reference for all purposes. New gate materials such as high K dielectric and metal gates are also used to increase performance. However, processing steps in forming the memory cells can adversely affect the concurrently fabricated logic devices, and vice versa.

There is a need for an improved method of making a device that includes memory cells, low voltage logic devices and high voltage devices on the same substrate.

BRIEF SUMMARY OF THE INVENTION

The aforementioned problems and needs are addressed by a method of forming a semiconductor device that includes:
providing a substrate of semiconductor material that includes a first area, a second area and a third area;
recessing an upper surface of the substrate in the first area and an upper surface of the substrate in the second area relative to an upper surface of the substrate in the third area;
forming a pair of stack structures in the first area, wherein each of the stack structures includes a floating gate of conductive material disposed over and insulated from the upper surface of the substrate in the first area and a first non-floating gate of conductive material disposed over and insulated from the floating gate;
forming a first source region in the substrate between the pair of stack structures in the first area;
forming a second non-floating gate disposed over and insulated from the first source region in the first area;
forming a block of dummy material disposed over and insulated from the upper surface of the substrate in the third area;
forming third non-floating gates of conductive material disposed over and insulated from the upper surface of the substrate in the first area and each laterally adjacent to and insulated from one of the stack structures;
forming fourth non-floating gates of conductive material disposed over and insulated from the upper surface of the substrate in the second area;
forming first drain regions in the substrate in the first area, each adjacent to one of the third non-floating gates;
forming second source regions in the substrate in the second area, each adjacent to one of the fourth non-floating gates;
forming second drain regions in the substrate in the second area, each adjacent to one of the fourth non-floating gates;
forming a third source region in the substrate in the third area, adjacent to the block of dummy material;
forming a third drain region in the substrate in the third area, adjacent to the block of dummy material;
forming a first blocking layer over at least a portion of one of the fourth non-floating gates in the second area;
forming silicide on the first, second and third drain regions, on the second and third source regions, and on a top surface of the fourth non-floating gates which are not underneath the first blocking layer; and
replacing the block of dummy material with a block of metal material.

Other objects and features of the present invention will become apparent by a review of the specification, claims and appended figures.

BRIEF DESCRIPTION OF THE DRAWINGS

FIGS. 1A-14A are cross sectional views of the memory cell area showing the steps in forming the memory cells.

FIGS. 1B-14B are cross sectional views of the high voltage (HV) area showing the steps in forming the HV devices.

FIGS. 1C-14C are cross sectional views of the logic area showing the steps in forming the logic devices.

FIGS. 18A-19A, 18B-19B and 18C-19C are cross sectional views of the memory cell area, the HV area, and the logic area, respectively, showing the steps in forming the memory cells, the HV devices and the logic devices, respectively, in a first alternate embodiment.

FIGS. 20A-21A, 20B-21B and 20C-21C are cross sectional views of the memory cell area, the HV area, and the logic area, respectively, showing the steps in forming the memory cells, the HV devices and the logic devices, respectively, in a second alternate embodiment.

FIGS. 22A-23A, 22B-23B and 22C-23C are cross sectional views of the memory cell area, the HV area, and the logic area, respectively, showing the steps in forming the memory cells, the HV devices and the logic devices, respectively, in a third alternate embodiment.

FIGS. 24A-28A, 24B-28B and 24C-28C are cross sectional views of the memory cell area, the HV area, and the logic area, respectively, showing the steps in forming the memory cells, the HV devices and the logic devices, respectively, in a fourth alternate embodiment.

FIGS. 29A-30A, 29B-30B and 29C-30C are cross sectional views of the memory cell area, the HV area, and the logic area, respectively, showing the steps in forming the memory cells, the HV devices and the logic devices, respectively, in a fifth alternate embodiment.

FIGS. 31A-32A, 31B-32B and 31C-32C are cross sectional views of the memory cell area, the HV area, and the logic area, respectively, showing the steps in forming the memory cells, the HV devices and the logic devices, respectively, in a sixth alternate embodiment.

FIGS. 33A-34A, 33B-34B and 33C-34C are cross sectional views of the memory cell area, the HV area, and the logic area, respectively, showing the steps in forming the memory cells, the HV devices and the logic devices, respectively, in a seventh alternate embodiment.

FIGS. 33A, 33B, 33C and FIGS. 35A, 35B, 35C, are cross sectional views of the memory cell area, the HV area, and the logic area, respectively, showing the steps in forming the memory cells, the HV devices and the logic devices, respectively, in an eighth alternate embodiment.

FIGS. 33A, 33B, 33C and FIGS. 36A, 36B, 36C, are cross sectional views of the memory cell area, the HV area, and the logic area, respectively, showing the steps in forming the memory cells, the HV devices and the logic devices, respectively, in a ninth alternate embodiment.

DETAILED DESCRIPTION OF THE INVENTION

Figures 3A, 3B, 3C:
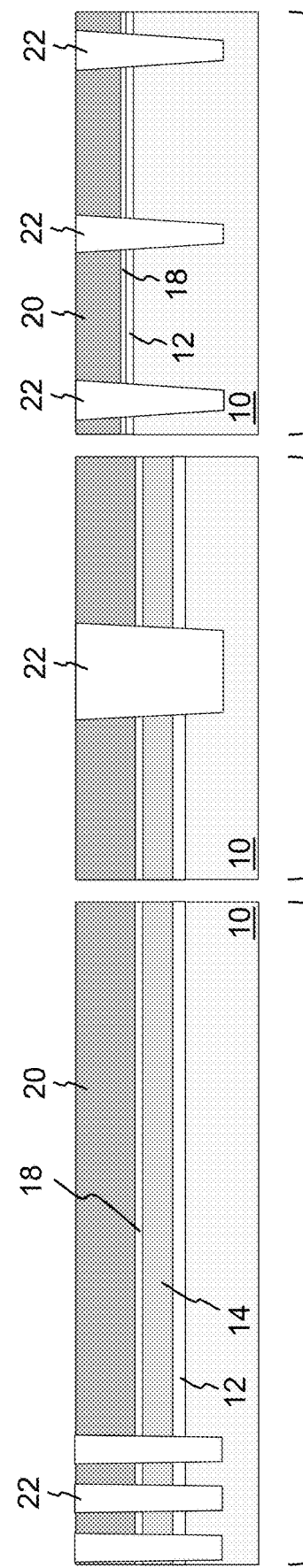

The present invention is a process of forming a semiconductor device by simultaneously forming memory cells, low voltage logic devices and high voltage logic devices on the same semiconductor substrate. The process described below involves forming memory cells in one or more memory cell areas (also referred to as first or MC areas) 2 of the substrate 10, high voltage logic devices in one or more high voltage logic device areas (also referred to as second or HV areas) 4 of the substrate 10, and low voltage logic devices in one or more low voltage logic device areas (also referred to a third or logic areas) 6 of the substrate 10. The process is described with respect to forming a pair of memory cells in the MC area 2, a high voltage logic device in the HV area 4, and a lower voltage logic device in the logic area 6, simultaneously. However, multiple such devices in each area are simultaneously formed. Substrate 10 is a substrate of semiconductor material (e.g., silicon).

Referring to FIGS. 1A-14A for the MC area 2, FIGS. 1B-14B for the HV area 4, and FIGS. 1C-14C for the logic area 6, there are shown cross-sectional views of the steps in the process to make a semiconductor device. The process begins by recessing the upper surface 10a of the silicon substrate 10 in the MC area 2 and HV area 4 by a recess amount R relative to the logic area 6. Recessing the substrate upper surface 10a is preferably performed by forming a silicon dioxide (hereinafter "oxide") layer on the substrate upper surface 10a and a silicon nitride (hereinafter "nitride") layer on the oxide layer. A photolithography masking step is performed to cover the logic area 6 but not the MC and HV areas 2/4 with photoresist (i.e., form photoresist over all three areas, selectively expose portion(s) of the photoresist, and selectively remove portion(s) of the photoresist, leaving exposed portion(s) of the underlying structure (in this case the nitride layer in the MC and HV areas 2/4), while leaving other portion(s) of the underlying structure covered by the photoresist (in this case the nitride layer in the logic area 6).

Nitride and oxide etches are performed to remove the silicon and nitride layers from the MC and HV areas 2/4, leaving the upper surface 10a in these areas exposed. After photoresist removal, a thermal oxidation is then performed to form an oxide layer on the exposed portions of the upper surface 10a in the MC and HV areas 2/4. This thermal oxidation process consumes some of the silicon of the substrate, effectively lowering the upper surface 10a in these areas. Nitride and oxide etches are then used to remove all the oxide and nitride layers from the logic area 6, resulting in the structure shown in FIGS. 1A, 1B and 1C. The upper surface 10a in the MC and HV areas 2/4 is recessed by an amount R (e.g., 200-700 Å) relative to the upper surface 10a in the logic area 6.

Next, an oxide layer 12 is formed on the upper surface 10a (e.g., by deposition or by thermal growth, etc.). Thereafter, a conductive layer such a polysilicon (hereinafter "poly") 14 is formed on oxide layer 12. Poly layer 14 could instead be amorphous silicon, either in-situ doped or undoped. An implantation and anneal is performed if undoped polysilicon or amorphous silicon is used for layer 14. A photolithography masking step is then performed to cover the MC and HV areas 2/4 with photoresist 16, but leaving the logic area 6 exposed (i.e., the photoresist 16 is removed from the logic area 6 as part of the masking step). A poly etch is then used to remove poly layer 14 from the logic area 6, as shown in FIGS. 2A, 2B and 2C.

After photoresist 16 is removed, an optional oxide layer 18 is formed over the structure, followed by a nitride layer 20 formed on oxide layer 18. A photolithography masking step is used to selectively cover portions of each area with photoresist. Nitride, oxide, poly and silicon etches are used to form trenches through nitride 20, oxide 18, poly 14, oxide 12 and into silicon substrate 10. Preferably the trenches are 2000Å-3500Å deep in the logic area 6 of substrate 10, and 1600Å-3300Å deep in the MC and HV areas 2/4 of substrate 10. The trenches are then filled with oxide 22 by oxide deposition and chemical mechanical polish (CMP) stopping on nitride layer 20, as shown in FIGS. 3A, 3B and 3C. Oxide 22 can also be referred to as STI (shallow trench isolation) oxide 22, which is a well know isolation technique. Oxide 22 can include a liner oxide formed by thermal oxidation before the oxide deposition.

A series of implants can be performed to create the desired wells in the substrate 10 in each of the areas 2/4/6 (with photoresist protecting one or more of the other areas during each implantation), followed by an oxide etch back to recess the STI oxide 22 below the top of nitride layer 20. A nitride etch is then used to remove nitride layer 20. An insulation layer 24 is then formed over the structure. Preferably, the insulation layer 24 is an ONO composite layer with oxide/nitride/oxide sublayers (formed by oxide, nitride, oxide depositions and anneal). However, insulation layer 24 could instead be formed of a composite of other dielectric layers, or a single dielectric material with no sublayers. A conductive layer such as polysilicon layer 26 is then formed on the structure by polysilicon deposition. Poly layer 26 could instead be amorphous silicon, either in-situ doped or undoped. A poly implantation and anneal is performed if undoped polysilicon or amorphous silicon is used for layer 14. A hard mask layer 28 is then formed on poly layer 26. Hard mask layer 28 can be nitride, SiCN, or even a composite of oxide, nitride and/or SiCN layers. The resulting structure is shown in FIGS. 4A, 4B and 4C.

A photolithography masking step is used to form photoresist 30 on the structure, where it is removed from the HV area 4 and selectively removed from the MC area 2 to expose hard mask layer 28 in the HV area 4 and expose only portions of hard mask layer 28 in the MC area 2. A series of etches are used to remove exposed portions of hard mask layer 28, poly layer 26 and insulation layer 24, leaving pairs of spaced apart stack structures S1 and S2 of hard mask layer 28, poly layer 26 and insulation layer 24 in the MC area 2, and entirely removing these layers from the HV area 4. The resulting structure is shown in FIGS. 5A, 5B and 5C.

After photoresist 30 is removed, an oxide deposition or thermal oxidation and etch are used to form spacers 32 along the sides of stacks S1 and S2 in the MC area 2. A nitride deposition and etch are used to form nitride spacers 34 along the sides of oxide spacers 32. The oxide and nitride etches could be combined. A poly etch is performed to remove the exposed portions of poly layer 14, with the result that each spaced apart stack structure S1/S2 includes a block of poly 14 as well. Poly layer 14 is entirely removed from the HV area 4. Oxide spacers 36 are formed on the sides of the stack structures S1/S2 including along the exposed ends of the block of poly layer 14 by oxide deposition and oxide anisotropic etch, as shown in FIGS. 6A, 6B and 6C.

Figure 7C:
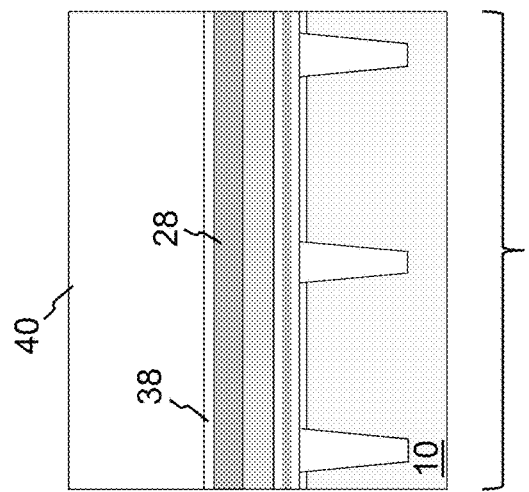
Figure 7B:
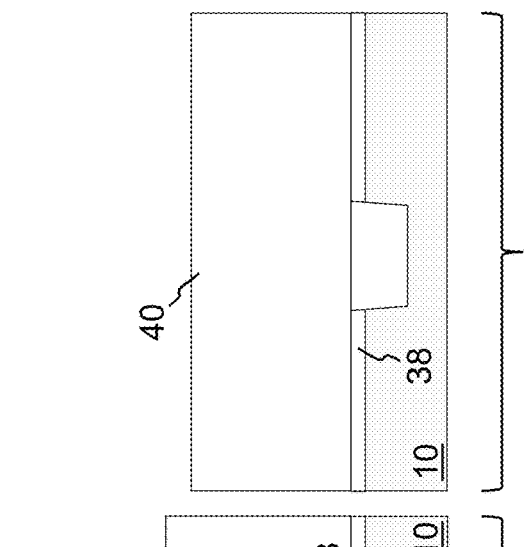
Figure 7A:
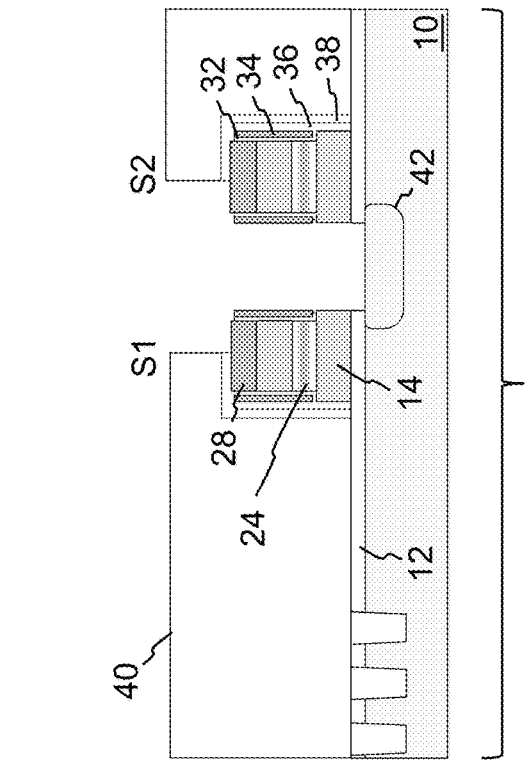

A photolithographic masking step is used to cover MC and logic areas 2/6 with photoresist, but leave exposed HV area 4. An oxide etch is used to remove oxide layer 12 from the HV area 4. After photoresist removal, insulation layer 38 is then formed on the substrate upper surface 10a in the HV area 4 by thermal growth and/or deposition, as well as on the structures in the MC and logic areas 2/6. Insulation layer 38 can be oxide and/or oxynitride, and will serve as the gate oxide for the HV devices. However, it should be noted that the removal and replacement of oxide 12 with insulation layer 38 is optional, and oxide 12 could instead be used as part of, or the entirety of, the gate oxide for the HV devices. After photoresist removal, photoresist 40 is formed on the structure and only removed from the area between the stacks S1 and S2 (referred to herein as the inner stack area) in the MC area 2. An implantation process is performed to form source regions 42 in the substrate between the stacks S1 and S2. An oxide etch is then used to remove insulation layer 38, oxide spacers 36 and the oxide layer 12 in the inner stack areas. The resulting structure is shown in FIGS. 7A, 7B and 7C.

After photoresist 40 removal, a tunnel oxide 44 is formed on the structure. The tunnel oxide 44 could be oxide and/or oxidenitride formed by deposition and/or thermal growth. Because of catalytic effects of the higher dopant levels in the source region 42, tunnel oxide 44 can have a thicker portion 44a on the source region 42. A photolithographic masking step is used to cover the HV and logic areas 4/6, and the inner stack area in the MC area, with photoresist. The areas on the other sides of stack structures S1 and S2 (referred to herein as the outer stack areas) are left exposed. An implant can be performed at this time for the portions of silicon substrate 10 in the outer stack areas (i.e., those substrate portions that will be under the select gates to be formed later). An oxide etch is used to remove exposed oxide layer 12 in the outer stack areas. After photoresist removal, oxide layer 46 is then formed on the structure. Oxide layer 46 can be oxide and/or oxynitride or any other appropriate dielectric material, formed by deposition and/or thermal growth. The formation of oxide layer 46 thickens or becomes part of tunnel oxide 44 and insulation layer 38. The resulting structure is shown in FIGS. 8A, 8B and 8C.

Figure 9A:
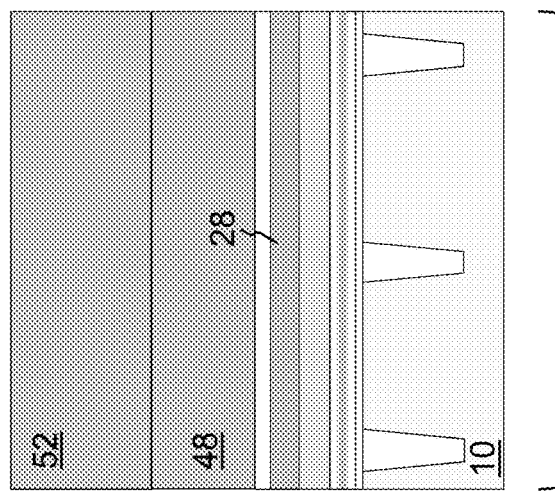
Figure 9B:
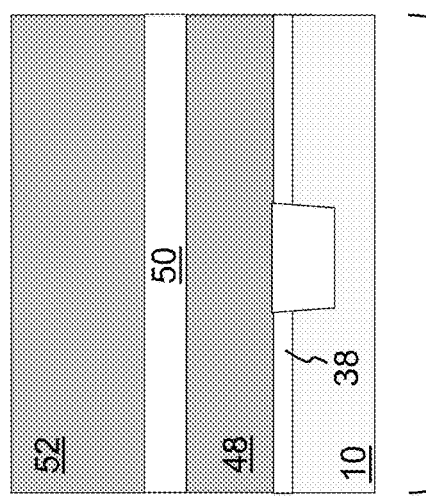
Figure 9C:
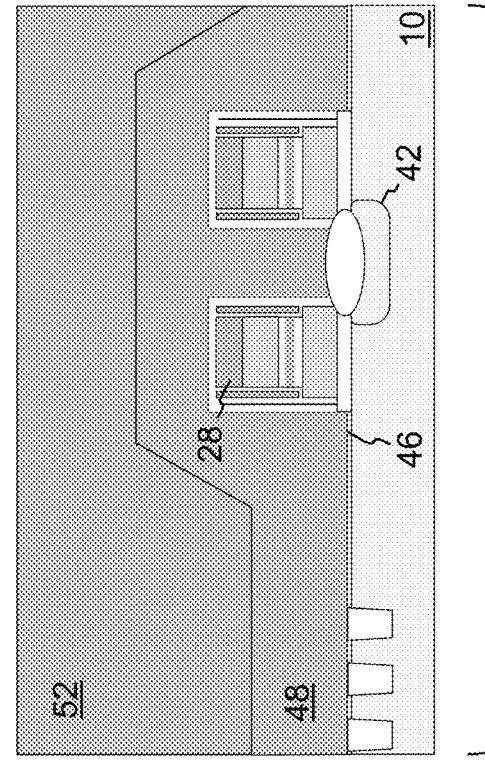

A conductive layer such as polysilicon layer 48 is formed on the structure. Poly layer 48 can be in-situ doped or undoped, and could instead be amorphous silicon. Doping and anneal would then be performed if undoped polysilicon or amorphous silicon is used for layer 48. A buffer oxide layer 50 is formed on poly layer 48. A photolithography masking step is used to cover the buffer oxide layer 50 in the HV area 4, but leave buffer oxide layer 50 exposed in the MC and logic areas 2/6. The exposed portions of buffer oxide layer 50 are then removed by oxide etch in the MC and logic areas 2/6. After photoresist removal, a conductive layer such as polysilicon layer 52 is then deposited on the structure (which could instead be amorphous silicon with the same doping as poly layer 48), as shown in FIGS. 9A, 9B and 9C. A poly chemical mechanical polish (CMP) is performed to planarize the top surface of the structure, stopping on the hard mask layer 28. A further poly etch back process is used to recess the poly layer 48 upper surface below the tops of stacks S1 and S2. This completes the majority of the memory cell formation. An oxide etch is used to remove the buffer oxide 50 in the HV area 4. A protective insulation layer 54 is formed over the structure. Protective insulation layer 54 can be oxide, nitride, SiCN or combinations thereof. A photolithographic masking step is used to cover the MC and HV areas 2/4 with photoresist, while leaving the logic area 6 exposed. An etch is used to remove protective insulation layer 54 in the logic area 6. After photoresist removal, a series of etches are then performed to remove all the layers of material in the logic area 6, leaving the upper surface 10a of the substrate exposed, as shown in FIGS. 10A, 10B and 10C. The protective insulation layer 54 protects the MC and HV areas 2/4 from this series of etches.

Figures 11A, 11B, 11C:
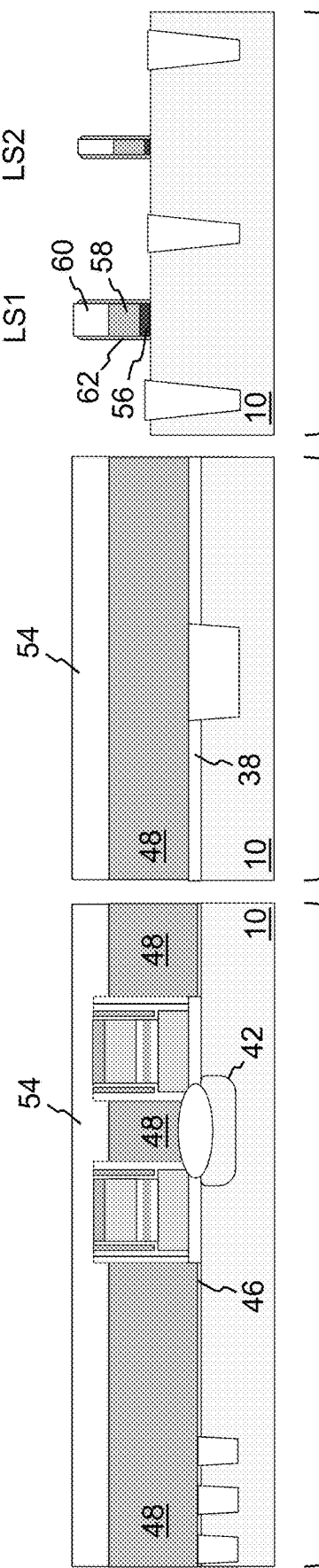

Implantations can be performed at this time to form doped P and N wells in the substrate 10 in the logic area 6. A dielectric layer 56 is formed on the exposed substrate upper surface 10a in the logic area 6 (which can serve as the gate dielectric for the logic devices). Dielectric layer 56 can be silicon oxide, silicon oxynitride, a high-K dielectric layer, or a composite thereof. A high K insulation material is insulation material having a dielectric constant K greater than that of silicon dioxide. Examples of high K insulation materials include $HfO_2$, $ZrO_2$, $TiO_2$, $Ta_2O_5$, and combinations thereof. A dummy conductive layer 58 of dummy material such as polysilicon is then formed over the structure. A hard mask layer 60 is then formed on dummy conductive layer 58. A photolithography masking step is used to cover select portions of the logic area 6 with photoresist, leaving hard mask layer 60 in the entire MC and HV areas 2/4, as well as part of the logic area 6 exposed. An etch is then used to remove the exposed areas of the hard mask layer 60 in the MC, HV, and logic areas 2/4/6. After photoresist removal, etches are used to remove the exposed portions of dummy conductive layer 58 and dielectric layer 56 (i.e., all portions not protected by the remaining portions of hard mask layer 60 in the logic area 6), leaving logic stack structures LS1 and LS2 in the logic area 6 (i.e., with a block of dummy material 58 insulated from the substrate by dielectric layer 56). Dielectric spacers 62 are formed on the sides of logic stack structures LS1/LS2 by deposition and etch. Implantations into the substrate 10 in the logic area 6 can be performed at this time. The resulting structure is shown in FIGS. 11A, 11B and 11C.

A photolithography masking step is used cover the logic area 6, portions of HV area 4, and portions of the MC area 2, with photoresist 64 (i.e., cover the inner stack area, stack structures S1 and S2, and those portions of the outer stack areas immediately adjacent stack structures S1 and S2). Etches are used to remove exposed portions of protective insulation layer 54 and poly layer 48, as shown in FIGS. 12A, 12B and 12C. After photoresist 64 is removed, additional selective implantations and etches can be performed in the different exposed portions of silicon substrate 10 (i.e., by additional photolithography mask steps and implantations). For example, the HV and logic areas 4/6 can be covered by photoresist leaving MC area 2 exposed, and the portions of substrate 10 only covered by oxide layer 46 are subjected to implantation. The MC and logic areas 2/6 can be covered by photoresist leaving HV area 4 exposed, and the portions of substrate 10 only covered by oxide layer 38 are subjected to implantation.

Oxide and nitride depositions, followed by a spacer etch, are used to form oxide spacers 66 and nitride spacers 68 on the sides of stack structures S1/S2 in the MC area 2, on the sides of stack structures LS1/LS2 in the logic area 6, and on the sides of the structures in the HV area 4. Implantations are performed to form drain regions 74 in the substrate adjacent the nitride spacers 68 in the MC area 2, source and drain regions 76/78 adjacent the nitride spacers 68 in the HV area 4, and source and drain regions 80/82 adjacent the nitride spacers 68 in the logic area 6. Implantations for any given region can be performed by forming photoresist to block the implantation for other region(s) not to be implanted. For example, drain regions 74 in the MC area 2, source/drain regions 76/78 in the HV area 4, and source/drain regions 80/82 in the logic area 6, of the same doping type, can be formed simultaneously by forming photoresist on area of the opposite source/drain doping type, and then performing a single implantation in the MC, HV, and logic areas 2/4/6. A blocking layer 84 (first blocking layer) is deposited over the structure. A masking step is performed to only cover those regions in which the blocking layer 84 is to remain with photo resist. Then, one or more etches are performed to remove the protective insulation layer 54 from the MC and HV areas 2/4, remove the exposed portions of blocking layer 84, and remove exposed portions of oxide layer 46 in the MC area 2 and oxide layer 38 in the HV area 4. After photo resist removal, metal deposition and anneal is then performed to form silicide 86 on the top surfaces of exposed blocks of poly 48, source regions 76/80 and drain regions 74/78/82. Blocking layer 84 prevents silicide formation for any portions for which such formation is not desired. Optionally, blocking layer 84 can be maintained in select portions of the source/drain areas 74/76/78/80/82 and/or the poly gate areas 48, to block silicide formation in these select regions. The resulting structure is shown in FIGS. 13A, 13B and 13C.

Etches are used to remove remaining portions of hard mask layer 60 on the stack structures LS1/LS2 in the logic area 6, hard mask layer 28 on the stack structures S1/S2 in the MC area 2, and any exposed nitride spacers 68 in all three areas. A layer 88 (e.g., nitride) is formed over the structure. A relatively thick layer of inter-layer dielectric (ILD) insulation material 90 is then formed on layer 88. CMP is performed to planarize and recess the ILD insulation material 90 to expose dummy conductive layer 58 in the logic area 6. A photolithography masking step is used to cover the MC and HV areas 2/4 with photoresist, while leaving the logic area 6 exposed. A poly etch is then used to remove the blocks of dummy conductive layer 58 in the logic area 6. Optionally, dielectric layer 56 can also be removed in this step. After photoresist removal, optionally, a dielectric layer 92, such as a silicon oxide, oxynitride, high-K dielectric layer, or a composite thereof, can be deposited over the structure. A layer of metal gate material 94 such as Al, Ti, TiAlN, TaSiN, TaN, TiN, or other appropriate metal material, etc. or a composite thereof, is formed over the dielectric layer 92. A CMP is then performed to remove the dielectric layer 92 and metal gate material layer 94, leaving blocks of metal material 94 lined with the dielectric layer 92 in the logic area 6. The final structure is shown in FIGS. 14A, 14B and 14C.

Figure 15:
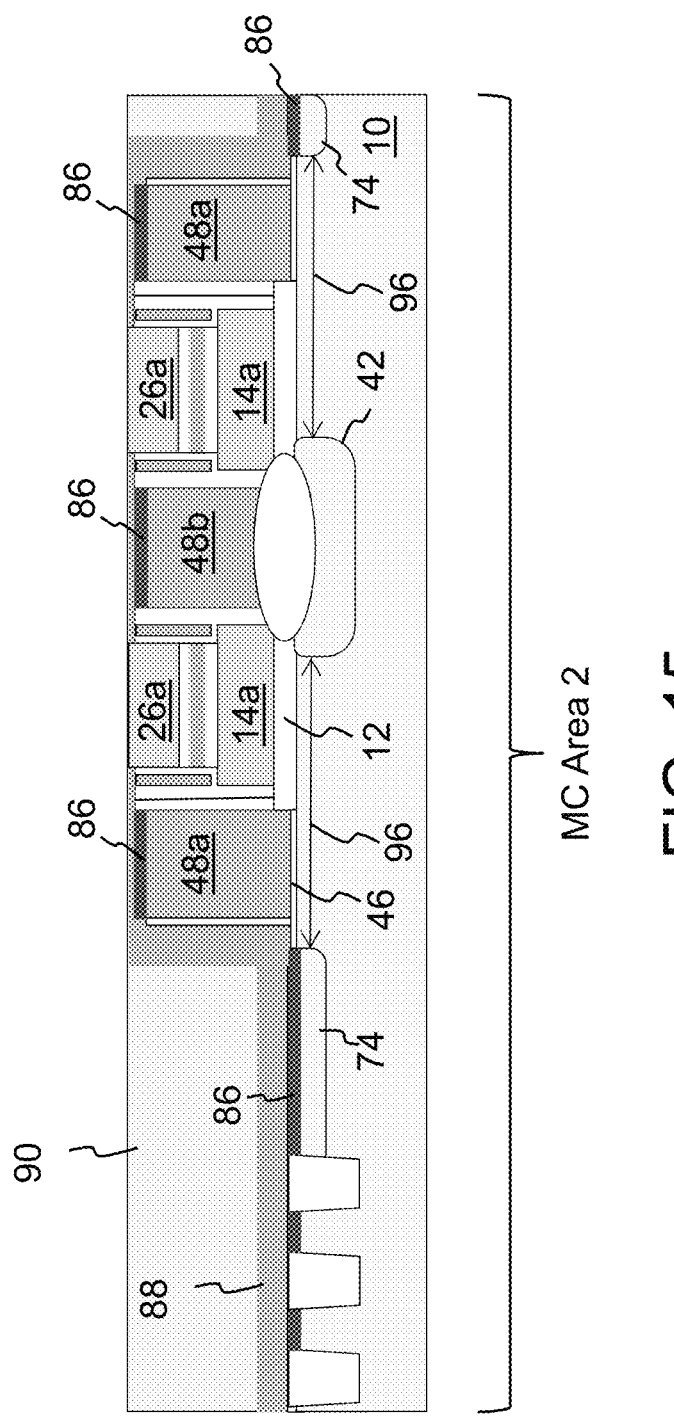
FIG. 15 is a cross sectional view of the memory cell area showing the finished memory cells.

FIG. 15 shows the final memory cell structure in the MC area 2, which includes pairs of memory cells each sharing source region 42 (first source region) spaced apart from two drain regions 74 (first drain regions), with channel regions 96 in the silicon substrate 10 extending there between. Each memory cell includes a floating gate 14a (formed from the remainder of poly layer 14) disposed over and insulated from a first portion of the channel region 96 for controlling the conductivity thereof, a control gate 26a (a first non-floating gate, formed from the remainder of poly layer 26) disposed over and insulated from the floating gate 14a, an erase gate 48b (a second non-floating gate, formed from a second portion of poly layer 48) disposed over and insulated from the source region 42 (shared by the pair of memory cells), and a select gate 48a (a third non-floating gate, which can also be referred to a word line gate, and is formed from a first portion of poly layer 48) disposed over and insulated from a second portion of the channel region 96 for controlling the conductivity thereof. The pairs of memory cells extend in the column direction (bit line direction), and columns of the memory cells are formed, with oxide 22 between adjacent columns. A row of the control gates 26a are formed as a continuous control gate line that connects the control gates 26a together for an entire row of the memory cells. A row of the select gates 48a are formed as a continuous select gate line (also known as a word gate line) that connects the select gates 48a together for an entire row of the memory cells. A row of the erase gates 48b are formed as a continuous erase gate line that connects the erase gates 48b together for an entire row of pairs of the memory cells.

Figure 16:
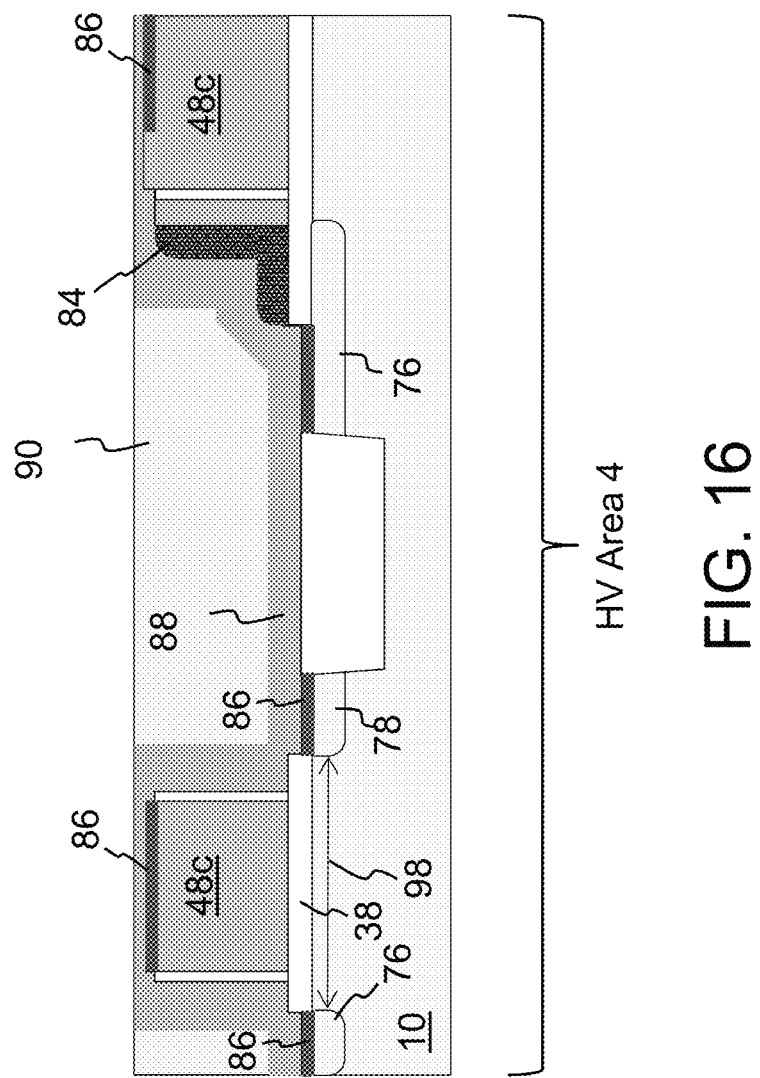
FIG. 16 is a cross sectional view of the HV area showing the finished HV devices.

The final HV devices in the HV area 4 are shown in FIG. 16. Each HV device includes spaced apart source and drain regions 76 and 78 (second source and drain regions) with a channel region 98 of the silicon substrate 10 extending there between. A conductive gate 48c (fourth non-floating gate), formed from a third portion of poly layer 48, is disposed over and insulated from the channel region 98 for controlling the conductivity thereof.

Figure 17:
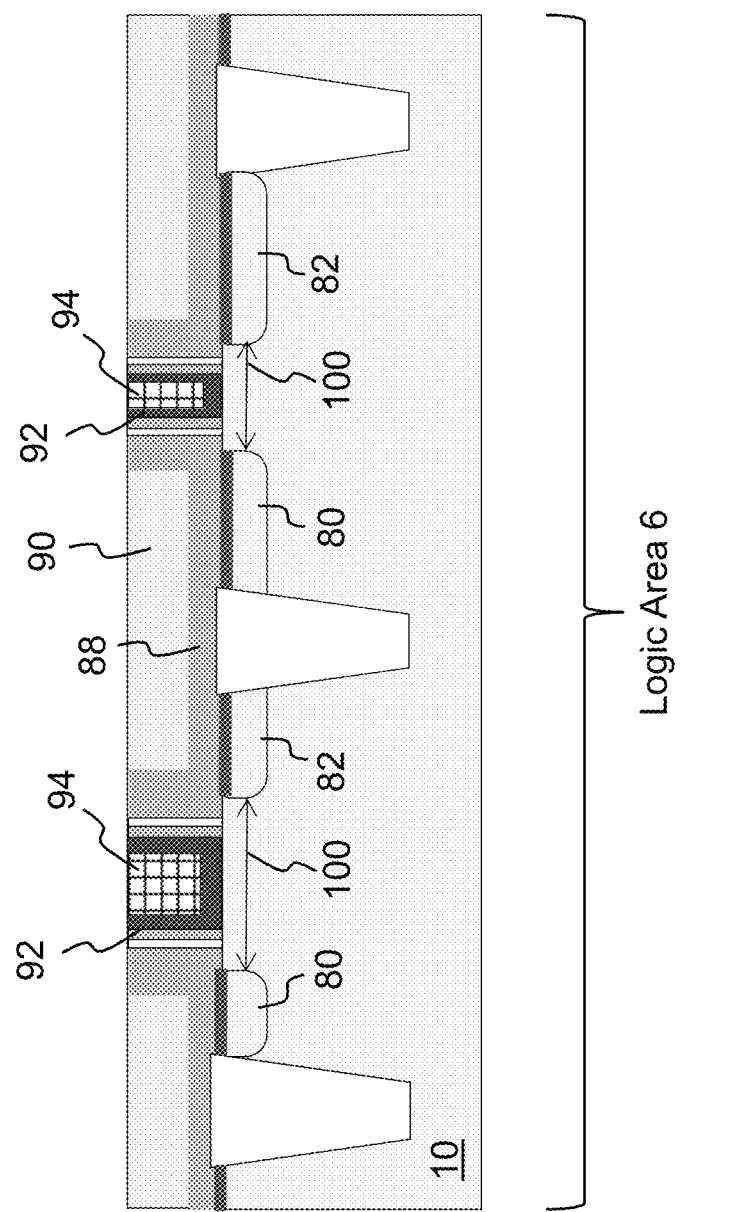
FIG. 17 is a cross sectional view of the logic area showing the finished logic devices.

The final logic devices in the logic area 6 are shown in FIG. 17. Each logic device includes spaced apart source and drain regions 80 and 82 (third source and drain regions) with a channel region 100 of the silicon substrate 10 extending there between. A metal gate 94 is disposed over and insulated from the channel region 100 (by dielectric layer 92) for controlling the conductivity thereof.

There are a number of advantages of the above described method of forming memory cells, HV devices and logic devices on the same substrate. The memory cells and HV devices formation is completed before the optional high K dielectric and metal gates are formed in the logic area 6, so that the optional high K dielectric layer 92 and metal gates 94 in the logic area 6 will not be adversely affected by the formation of the memory cells and HV devices. The process steps for the formation of the gates in the MC and HV areas 2/4 are separate and independent from (and can be customized relative to) the process steps for the formation of the gates in the logic area 6. The MC and HV areas 2/4 are covered by protective insulation layer 54 after most of the memory cell and HV device formation is completed and before the processing in the logic area 6 (i.e., before the removing of the layers in the logic area 6 left from the memory cell and HV device formation, and before the depositing and removing of the layers used for forming the logic devices including dummy conductive layer 58 removal, without limitation). The upper surface 10a of the silicon substrate 10 is recessed in the MC and HV areas 2/4 relative to that in the logic area 6 to accommodate the taller structurers in the MC/HV areas 2/4 (i.e., so that tops of the shorter logic devices in the logic area 6 are slightly higher than the tops of the taller memory cells and HV devices in the MC/HV areas 2/4, and so that CMP across all three areas can be used for processing—e.g., the tops of the select gates 48a and HV gates 48c are intact during logic gate formation CMP steps). Layer 88 protects the silicided poly blocks 48 from the CMP used in forming the metal logic gates 94, and the control gate poly 26 assists as a stop layer for this CMP. Silicide 86 enhances the conductivity of the drain regions 74, and source/drain regions 76/78, source/drain regions 80/82, select gates 48a, erase gates 48b and HV gates 48c. The memory cell select gates 48a, memory cell erase gates 48b and HV device gates 48c, can be formed using a single conductive material deposition (i.e., a single polysilicon layer formed by a single polysilicon deposition can be used to form all three types of gates). Moreover, the same poly etch can be used define one of the edges of each select gate 48a and both edges of each HV gate 48c. The thicknesses of the various layers 46, 12, 38 and 56 under the various gates are independent of each other with each optimized for its respective gate operation. For example, oxide layer 46 under the select gates 48a is preferably thinner than oxide layer 12 under the floating gates 14a. Finally, the same etch or set of etches are used to remove the protective insulation layer 54 from the MC and HV areas 2/4 and the exposed portions of blocking layer 84, at the same point in the process, which simplifies and enhances the reliability of this portion of the formation process.

FIGS. 18A-18C and 19A-19C illustrate a first alternate embodiment, which begins with the same processing steps described above with respect to FIGS. 1A-12A for the MC area 2, FIGS. 1B-12B for the HV area 4, and FIGS. 1C-12C. Starting with the structures shown in FIGS. 12A, 12B and 12C, after photoresist 64 is removed, oxide spacers 66 and nitride spacers 68 are formed as described above. Then, a masking step is performed to cover the logic area 6 with photo resist 102, but leaves the memory and HV areas 2/4 exposed, as shown in FIGS. 18A, 18B and 18C. One or more etches are then used to remove the protective layer 54 from the MC and HV areas 2/4, which also removes the exposed oxide layer 46 in the MC area 2 and partially removes (i.e., thins) exposed portions of insulation layer 38 in the HV area 4. After the photo resist 102 is removed, source regions 76/80 and drain regions 74/78/82 are formed by implantation as described above. The blocking layer 84 is deposited over the structure. A masking step is performed to only cover those regions in which the blocking layer 84 is to remain with photo resist. Then, an etch is performed to remove the exposed portions of blocking layer 84. After photo resist removal, metal deposition and anneal is then performed to form silicide 86 on the top surfaces of exposed blocks of poly 48, source regions 76/80 and drain regions 74/78/82. The resulting structure is shown in FIGS. 19A, 19B and 19C, which is essentially the same as the structure in FIGS. 13A, 13B and 13C, except blocking layer 84 is formed on a portion of layer 38 that was previously thinned. The steps described above with respect to FIGS. 14A-14C are then performed to complete the process.

The additional advantages of this first alternate embodiment are that the masking step with photo resist 102 can remove or thin down layers 38, 46 and 54 in MC area 2 and HV area 4 before the subsequent etch of blocking layer 84, and the formation of silicide layer 86 can be performed without changing the etch recipe for blocking layer 84 so that there is no adverse impact on the performance of the resulting logic devices.

The additional advantages of this first alternate embodiment are that as a result of the masking step with photo resist 102 the one or more etches can remove or thin down layers 38, 46 and 54 in the MC area 2 and the HV area 4 before the subsequent deposition and etch of blocking layer 84, and the formation of the silicide layer 86 can be performed without changing the etch recipe for blocking layer 84 so that there is no adverse impact on the performance of the resulting logic devices.

FIGS. 20A-20C and 21A-21C illustrate a second alternate embodiment, which begins with the same processing steps described above with respect to FIGS. 1A-12A for the MC area 2, FIGS. 1B-12B for the HV area 4, and FIGS. 1C-12C. Starting with the structures shown in FIGS. 12A, 12B and 12C, after photoresist 64 is removed, oxide spacers 66 and nitride spacers 68 are formed as described above. Then, a masking step is performed to cover the logic area 6 with photo resist 104, cover the spacers 66/68 and exposed portions of oxide layer 46 in the MC area 2 with photo resist 104, but leave the remaining portions of MC area 2 and the entire HV area 4 exposed, as shown in FIGS. 20A, 20B and 20C. One or more etches are then used to remove the protective insulation layer 54 from the MC and HV areas 2/4, which also partially removes (i.e., thins) exposed portions of insulation layer 38 in the HV area 4. After the photo resist 104 is removed, source regions 76/80 and drain regions 74/78/82 are formed by implantation as described above. The blocking layer 84 is then deposited over the structure. A masking step is performed to only cover those regions in which the blocking layer 84 is to remain with photo resist. Then, an etch is performed to remove the exposed portions of blocking layer 84, which also removes the exposed portions of oxide layer 46 in the MC area 2. After photo resist removal, metal deposition and anneal is then performed to form silicide 86 on the top surfaces of exposed blocks of poly 48, source regions 76/80 and drain regions 74/78/82. The resulting structure is shown in FIGS. 21A, 21B and 21C, which is essentially the same as the structure in FIGS. 13A, 13B and 13C, except blocking layer 84 is formed on a portion of layer 38 that was previously thinned. The steps described above with respect to FIGS. 14A-14C are then performed to complete the process.

The additional advantages of this second alternate embodiment include no impact on the baseline logic process by the formation of the silicide, and photo resist 104 covering the drain regions 74 in the MC area 2 can protect the height of the STI oxide 22 for better memory cell performance control.

FIGS. 22A-22C and 23A-23C illustrate a third alternate embodiment, which begins with the same processing steps described above with respect to FIGS. 1A-12A for the MC area 2, FIGS. 1B-12B for the HV area 4, and FIGS. 1C-12C. Starting with the structures shown in FIGS. 12A, 12B and 12C, after photoresist 64 is removed, oxide spacers 66 and nitride spacers 68 are formed as described above. Then, a masking step is performed to cover the logic area 6 with photo resist 106, cover the spacers 66/68 and exposed portions of oxide layer 46 in the MC area 2 with photo resist 106, cover the portion of the protective insulation layer 54 that is vertically over source region 42 in the MC area 2 with photo resist 106, but leave the remaining portions of MC area 2 and the entire HV area 4 exposed, as shown in FIGS. 22A, 22B and 22C. One or more etches are then used to remove the exposed portions of protective insulation layer 54 from the MC area 2, remove the protective insulation layer 54 from the HV area 4, which also partially removes (i.e., thins) exposed portions of insulation layer 38 in the HV area 4. After the photo resist 106 is removed, source regions 76/80 and drain regions 74/78/82 are formed by implantation as described above. The blocking layer 84 is deposited over the structure. A masking step is performed to only cover those regions in which the blocking layer 84 is to remain with photo resist. Then, an etch is performed to remove the exposed portions of blocking layer 84, which also removes the exposed portions of oxide layer 46 in the MC area 2. After photo resist removal, metal deposition and anneal is then performed to form silicide 86 on the top surfaces of exposed blocks of poly layer 48, source regions 76/80 and drain regions 74/78/82. The resulting structure is shown in FIGS. 23A, 23B and 23C, which is essentially the same as the structure in FIGS. 13A, 13B and 13C, except blocking layer 84 is formed on a portion of insulation layer 38 that was previously thinned, and silicide is not formed on poly block 48 (eventually erase gate 48b) disposed vertically over the source region 42 in the MC area 2. The steps described above with respect to FIGS. 14A-14C are then performed to complete the process.

The additional advantages of this third alternate embodiment include no impact on baseline logic process by the silicide 86 formation, photo resist 106 covering drain region 74 in the MC area 2 can protect the height of the STI oxide 22 for better memory cell performance control, and photo resist 106 covering erase gate 48b in the MC area 2 protects layer 54 from etching.

FIGS. 24A-28A, 24B-28B and 24C-28C illustrate a fourth alternate embodiment, which begins with the same processing steps described above with respect to FIGS. 1A-12A for the MC area 2, FIGS. 1B-12B for the HV area 4, and FIGS. 1C-12C. Starting with the structures shown in FIGS. 12A, 12B and 12C, after photoresist 64 is removed, a masking step is performed to cover the MC and logic areas 2/6 with photo resist 108, leaving HV area 4 exposed. An implantation can be performed into the HV area 4 portion of silicon substrate 10. An oxide etch is then used to thin protective insulation layer 54 and exposed portions of insulation layer 38 in the HV area 4, as shown in FIGS. 24A, 24B and 24C. After photo resist 108 is removed, oxide spacers 66 and nitride spacers 68 are formed as described above. Source regions 76/80 and drain regions 74/78/82 are then formed by implantation as described above. The blocking layer 84 is deposited over the structure. A masking step is performed to only cover those regions in which the blocking layer 84 is to remain with photo resist. Then, an etch is performed to remove the exposed portions of blocking layer 84, which also removes the exposed portions of oxide layer 46 in the MC area 2 and exposed portions of the thinned protective insulation layer 54 in the HV area 4. After photo resist removal, metal deposition and anneal is then performed to form silicide 86 on the top surfaces of exposed blocks of poly layer 48 in the HV area 4, source regions 76/80 and drain regions 74/78/82. The resulting structure is shown in FIGS. 25A, 25B and 25C, which is essentially the same as the structure in FIGS. 13A, 13B and 13C, except blocking layer 84 is formed on a portion of insulation layer 38 that was previously thinned, and silicide is not formed on the block of poly layer 48 in the MC area 2.

As disclosed similarly above, etches are used to remove remaining portions of hard mask layer 60 on the stack structures LS1/LS2 in the logic area 6, hard mask layer 28 on the stack structures S1/S2 in the MC area 2, and any exposed nitride spacers 68 in all three areas. A layer 88 (e.g., nitride) is formed over the structure. A relatively thick layer of inter-layer dielectric (ILD) insulation material 90 is then formed on layer 88. CMP is performed to planarize the ILD insulation material 90 to expose blocks of poly layer 26 and poly layer 48 in the MC area 2, and dummy conductive layer 58 in the logic area 6. The resulting structure is shown in FIGS. 26A, 26B and 26C.

Figures 27A, 27B, 27C:
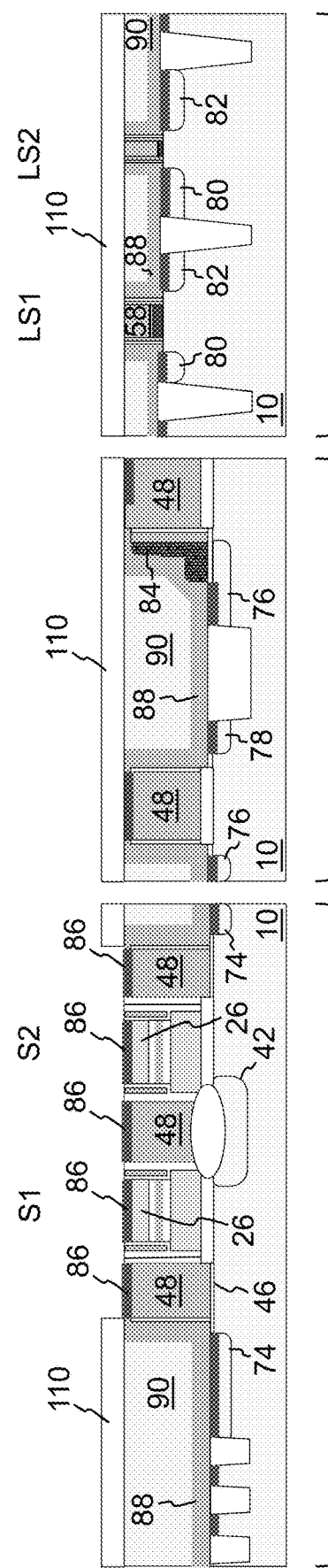

A blocking layer 110 (second blocking layer) is formed over the structure and patterned using a masking step to expose portions of the MC area 2 (i.e. exposing poly blocks 48 and poly blocks 26) while leaving the HV and logic areas 4/6 covered by second blocking layer 110. Metal deposition and anneal is then performed to form silicide 86 on the top surfaces of exposed blocks of poly layer 48 and poly layer 26 in the MC area 2, as shown in FIGS. 27A, 27B and 27C. A masking step is used to cover the structure with photo resist except logic area 6. Blocking layer 110 is then removed from the logic area 6. As similarly described above, a poly etch is then used to remove the blocks of dummy conductive layer 58 in the logic area 6. Optionally, dielectric layer 56 can also be removed in this step. After photoresist removal, optionally, dielectric layer 92, such as a silicon oxide, oxynitride, high-K dielectric layer, or a composite thereof, can be deposited over the structure. A layer of metal gate material 94 such as Al, Ti, TiAlN, TaSiN, TaN, TiN, or other appropriate metal material, without limitation, or a composite thereof, is formed over the dielectric layer 92. A CMP is then performed to remove the dielectric layer 92 and metal gate material layer 94, leaving blocks of the metal gate material 94 lined with the dielectric layer 92 in the logic area 6. The final structure is shown in FIGS. 28A, 28B and 28C.

The advantages for the fourth alternate embodiment include as a result of the masking step to form photo resist 108 the oxide etch can remove or thin down layers 38 and 54 in the HV area 4 before the subsequent etch of blocking layer 84 without changing the logic process blocking layer 84 etch recipe, the silicide layer 86 can be formed without adversely impacting on logic device performance, and memory cell performance is improved by exposing the poly blocks 48 and 26 for silicide formation in the MC area 2 without impacting any other regions which are protected by blocking layer 110.

Figures 26A, 26B, 26C:
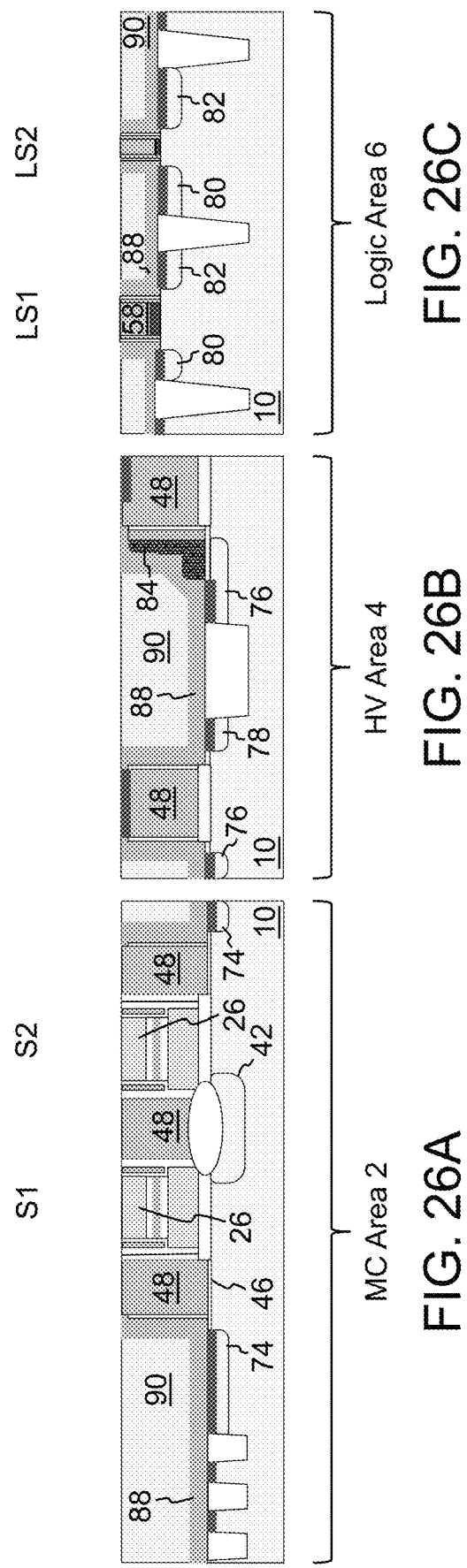

FIGS. 29A-30A, 29B-30B and 29C-30C illustrate a fifth alternate embodiment, which begins with the structure of FIGS. 26A, 26B and 26C described above with respect to the fourth alternate embodiment. Second blocking layer 110 is formed as described above over the structure, but is patterned using a masking step to expose portions of the MC area 2 (i.e. exposing poly blocks 48 but leaving poly blocks 26 covered) while leaving the HV and logic areas 4/6 covered by second blocking layer 110. Metal deposition and anneal is then performed to form silicide 86 on the top surfaces of exposed blocks of poly 48 in the MC area 2, as shown in FIGS. 29A, 29B and 29C. The steps described above with respect to FIGS. 28A-28C are then performed to complete the process, as shown in FIGS. 30A, 30B and 30C.

The additional advantages of this fifth alternate embodiment include blocking layer 110 covering poly blocks 26 to prevent silicide forming on poly blocks 26 that might bridge over to silicide 86 formed on poly blocks 48.

FIGS. 31A-32A, 31B-32B and 31C-32C illustrate a sixth alternate embodiment, which begins with the structure of FIGS. 26A, 26B and 26C described above with respect to the fourth alternate embodiment. Second blocking layer 110 is formed as described above over the structure, but is patterned using a masking step to expose portions of the MC area 2 (i.e. exposing some of the poly blocks 48, but leaving poly blocks 26 and poly block 48 over source region 42 covered) while leaving the HV and logic areas 4/6 covered by second blocking layer 110. Metal deposition and anneal is then performed to form silicide 86 on the top surfaces of exposed poly blocks 48 in the MC area 2, as shown in FIGS. 31A, 31B and 31C. The steps described above with respect to FIGS. 28A-28C are then performed to complete the process, as shown in FIGS. 32A, 32B and 32C.

The additional advantages of this sixth alternate embodiment include blocking layer 110 covering poly blocks 26 and 48b to avoid two closely spaced silicide layers on poly blocks 26 and 48 from bridging together, and also avoids the oxide layer 44 from being damaged while the second blocking layer 110 is being etched.

FIGS. 33A-34A, 33B-34B and 33C-34C illustrate a seventh alternate embodiment, which begins with the structure of FIGS. 26A, 26B and 26C described above with respect to the fourth alternate embodiment. This seventh alternate embodiment is similar to the fourth alternate embodiment, except that the metal logic gate material 94 is formed before memory cell gate silicide formation (using the above described process with respect FIGS. 14A, 14B, 14C) as shown in FIGS. 33A, 33B, 33C. Then, second blocking layer 110 is formed over the structure and patterned using a masking step to expose portions of the MC area 2 (i.e. exposing poly blocks 48 and poly blocks 26) while leaving the HV and logic areas 4/6 covered by second blocking layer 110. Metal deposition and anneal is then performed to form silicide 86 on the top surfaces of exposed blocks of poly 48 and poly 26 in the MC area 2, as shown in FIGS. 34A, 34B and 34C.

The additional advantages of this seventh alternate embodiment include better memory cell performance, poly blocks 48 and 26 are exposed and silicide is formed thereon without adversely impacting any other regions with blocking layer 110, and silicide is formed on poly blocks 48 and 26 after metal gate formation in the logic area to avoid any metal CMP polishing of the silicide 86 if the height of the memory cells is higher than the top surface of metal gate 94.

Figures 35A, 35B, 35C:
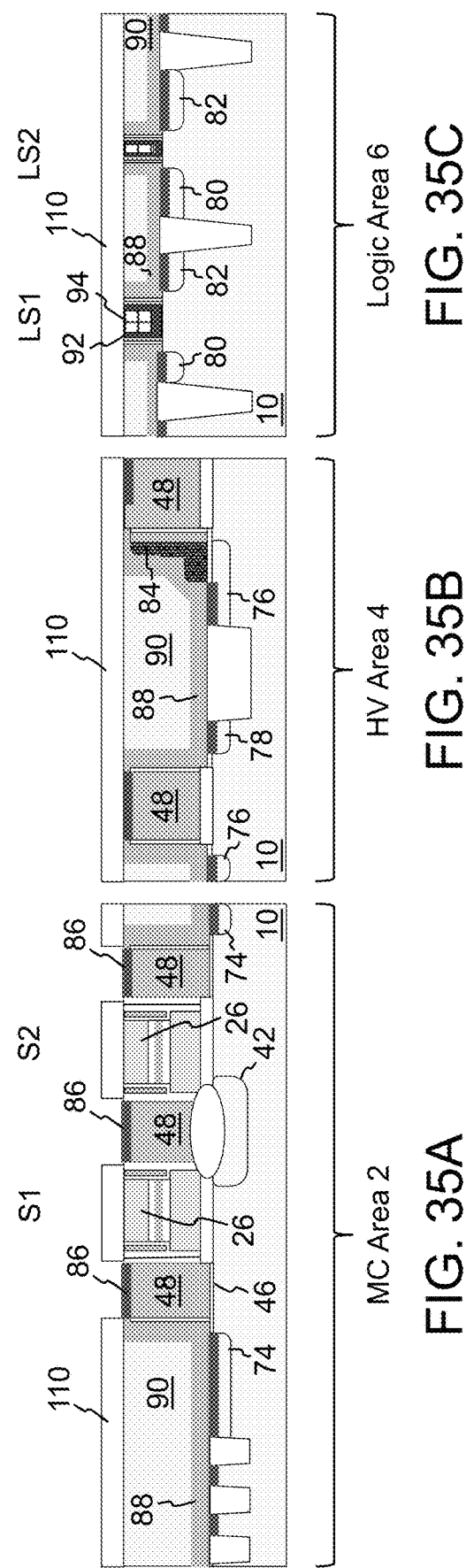

FIGS. 33A, 33B, 33C and FIGS. 35A, 35B, 35C illustrate an eighth alternate embodiment, which begins with the structure of FIGS. 26A, 26B and 26C described above with respect to the fourth alternate embodiment. This eighth alternate embodiment is similar to the fifth alternate embodiment, except that the metal logic gate material 94 is formed before memory cell gate silicide formation (using the above described process with respect FIGS. 14A, 14B, 14C) as shown in FIGS. 33A, 33B, 33C. Then, second blocking layer 110 is formed over the structure and patterned using a masking step to expose portions of the MC area 2 (i.e. exposing poly blocks 48 but leaving poly blocks 26 covered) while leaving the HV and logic areas 4/6 covered by second blocking layer 110. Metal deposition and anneal is then performed to form silicide 86 on the top surfaces of exposed blocks of poly layer 48 in the MC area 2, as shown in FIGS. 35A, 35B and 35C.

The additional advantages of this eighth alternate embodiment include forming silicide 86 on poly blocks 48 and 26 after the metal gate formation in the logic area to avoid any metal CMP polishing of the silicide 86 if the height of the memory cells is higher than the top surface of metal gate 94, and blocking layer 110 covering poly blocks 26 to prevent silicide forming on poly blocks 26 that might bridge over to silicide 86 formed on poly blocks 48.

FIGS. 33A, 33B, 33C and FIGS. 36A, 36B, 36C illustrate a ninth alternate embodiment, which begins with the structure of FIGS. 26A, 26B and 26C described above with respect to the fourth alternate embodiment. This ninth alternate embodiment is similar to the sixth alternate embodiment, except that the metal logic gate material 94 is formed before memory cell gate silicide formation (using the above described process with respect FIGS. 14A, 14B, 14C) as shown in FIGS. 33A, 33B, 33C. Then, second blocking layer 110 is formed over the structure and patterned using a masking step to expose portions of the MC area 2 (i.e. exposing some of the poly blocks 48 but leaving poly blocks 26 and poly block 48 over source region 42 covered) while leaving the HV and logic areas 4/6 covered by second blocking layer 110. Metal deposition and anneal is then performed to form silicide 86 on the top surfaces of exposed poly blocks 48 in the MC area 2, as shown in FIGS. 36A, 36B and 36C.

The additional advantages of this ninth alternate embodiment include silicide 86 formed on poly blocks 48 after metal gate formation in the logic area to avoid any metal CMP polishing of the silicide if the height of the memory cells is higher than the top surface of metal gate 94, and blocking layer 110 covering poly blocks 26 and 48b to avoid two closely spaced silicide layers on poly blocks 26 and 48 from bridging together, and also avoids the oxide layer 44 from being damaged while the second blocking layer 110 is being etched.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell area and the logic areas of the present invention, unless otherwise specified in the claims. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
providing a substrate of semiconductor material that includes a first area, a second area and a third area;
recessing an upper surface of the substrate in the first area and an upper surface of the substrate in the second area relative to an upper surface of the substrate in the third area;
forming a pair of stack structures in the first area, wherein each of the stack structures includes a floating gate of conductive material disposed over and insulated from the upper surface of the substrate in the first area and a first non-floating gate of conductive material disposed over and insulated from the floating gate;

forming a first source region in the substrate between the pair of stack structures in the first area;

forming a second non-floating gate disposed over and insulated from the first source region in the first area;

forming a block of dummy material disposed over and insulated from the upper surface of the substrate in the third area;

forming third non-floating gates of conductive material disposed over and insulated from the upper surface of the substrate in the first area and each laterally adjacent to and insulated from one of the stack structures;

forming fourth non-floating gates of conductive material disposed over and insulated from the upper surface of the substrate in the second area;

forming first drain regions in the substrate in the first area, each adjacent to one of the third non-floating gates;

forming second source regions in the substrate in the second area, each adjacent to one of the fourth non-floating gates;

forming second drain regions in the substrate in the second area, each adjacent to one of the fourth non-floating gates;

forming a third source region in the substrate in the third area, adjacent to the block of dummy material;

forming a third drain region in the substrate in the third area, adjacent to the block of dummy material;

forming a first blocking layer over at least a portion of one of the fourth non-floating gates in the second area;

forming silicide on the first, second and third drain regions, on the second and third source regions, and on a top surface of the fourth non-floating gates which are not underneath the first blocking layer; and replacing the block of dummy material with a block of metal material.

2. The method of claim 1, wherein the forming of the second, third and fourth non-floating gates comprises:

forming a conductive layer disposed over and insulated from the upper surfaces in the first and second areas;

forming a protective insulation layer over the conductive layer in the first and second areas;

etching portions of the protective insulation layer and portions of the conductive layer in the first and second areas to form the third non-floating gates from a first portion of the conductive layer and to form the fourth non-floating gates from a third portion of the conductive layer, wherein a second portion of the conductive layer between the pair of stack structures constitutes the second non-floating gate.

3. The method of claim 2, further comprising:

performing one or more etches to remove portions of the protective insulation layer over the third and fourth non-floating gates and to remove at least a portion of the first blocking layer in the second area.

4. The method of claim 3, wherein the forming of the silicide further includes forming silicide on top surfaces of the second and third non-floating gates.

5. The method of claim 2, further comprising:

forming photo resist over the first, second and third areas;

removing the photo resist from the first and second areas;

after the removing of the photo resist and before the forming of the silicide, removing portions of the protective insulation layer over the second, third and fourth non-floating gates.

6. The method of claim 5, wherein the forming of the silicide further includes forming silicide on top surfaces of the second and third non-floating gates.

7. The method of claim 2, further comprising:

forming photo resist over the first, second and third areas;

removing the photo resist from the second area and a portion of the photo resist over the first, second and third non-floating gates;

after the removing of the photo resist and before the forming of the silicide, removing portions of the protective insulation layer over the second, third and fourth non-floating gates.

8. The method of claim 7, wherein the forming of the silicide further includes forming silicide on top surfaces of the second and third non-floating gates.

9. The method of claim 2, further comprising:

forming photo resist over the first, second and third areas;

removing the photo resist from the second area and portions of the photo resist over the third non-floating gates;

after the removing of the photo resist and before the forming of the silicide, removing portions of the protective insulation layer over the third and fourth non-floating gates.

10. The method of claim 9, wherein the forming of the silicide further includes forming silicide on top surfaces of the third non-floating gates.

11. The method of claim 2, further comprising:

forming photo resist over the first, second and third areas after the forming of the protective insulation layer and before the forming of the first blocking layer;

removing the photo resist from the second area; and thinning a portion of the protective insulation layer on the fourth non-floating gates.

12. The method of claim 11, wherein after the forming of the silicide, further comprising:

forming a second blocking layer over the first, second and third areas;

removing portions of the second blocking layer over the first, second and third non-floating gates;

forming silicide on top surfaces of the first, second and third non-floating gates.

13. The method of claim 11, wherein after the forming of the silicide, further comprising:

forming a second blocking layer over the first, second and third areas;

removing portions of the second blocking layer over the second and third non-floating gates;

forming silicide on top surfaces of the second and third non-floating gates.

14. The method of claim 11, wherein after the forming of the silicide, further comprising:

forming a second blocking layer over the first, second and third areas;

removing portions of the second blocking layer over the third non-floating gates;

forming silicide on top surfaces of the third non-floating gates.

15. The method of claim 11, wherein after the forming of the silicide and after the replacing of the block of dummy material with the block of metal material, further comprising:

forming a second blocking layer over the first, second and third areas;

removing portions of the second blocking layer over the first, second and third non-floating gates;

forming silicide on top surfaces of the first, second and third non-floating gates.

16. The method of claim 11, wherein after the forming of the silicide and after the replacing of the block of dummy material with the block of metal material, further comprising:
- forming a second blocking layer over the first, second and third areas;
- removing portions of the second blocking layer over the second and third non-floating gates;
- forming silicide on top surfaces of the second and third non-floating gates.

17. The method of claim 11, wherein after the forming of the silicide and after the replacing of the block of dummy material with the block of metal material, further comprising:
- forming a second blocking layer over the first, second and third areas;
- removing portions of the second blocking layer over the third non-floating gates;
- forming silicide on top surfaces of the third non-floating gates.

* * * * *